United States Patent [19]

Masuda et al.

[11] Patent Number: 5,497,263
[45] Date of Patent: Mar. 5, 1996

[54] VARIABLE DELAY CIRCUIT AND CLOCK SIGNAL SUPPLY UNIT USING THE SAME

[75] Inventors: Noboru Masuda, Tokorozawa; Kazumichi Yamamoto, Hachioji; Kazunori Nakajima, Kokubunji; Toshihiro Okabe; Akira Yamagiwa, both of Hadano; Mikio Yamagishi, Ome; Kazuo Koide, Iruma; Bunichi Fujita; Seiichi Kawashima, both of Hadano, all of Japan

[73] Assignee: Hitachi, Ltd., Tokyo, Japan

[21] Appl. No.: 117,525

[22] Filed: Sep. 7, 1993

[30] Foreign Application Priority Data

Sep. 10, 1992 [JP] Japan .................... 4-241723

[51] Int. Cl.⁶ .................... H03H 11/26; H03K 17/296
[52] U.S. Cl. .................... 327/278; 327/281; 327/395
[58] Field of Search .................... 307/595, 597, 307/602, 603; 327/276, 277, 284, 278, 393, 395

[56] References Cited

U.S. PATENT DOCUMENTS

| | | | |
|---|---|---|---|
| 4,063,308 | 12/1977 | Collins et al. | 364/200 |
| 4,330,750 | 5/1982 | Mayor | 307/597 |
| 4,677,499 | 6/1987 | Shirota | 307/595 |
| 4,694,208 | 9/1987 | Szabo | 307/595 |
| 4,797,586 | 1/1989 | Traa | 307/603 |
| 5,043,596 | 8/1991 | Masuda et al. | 307/262 |
| 5,144,174 | 9/1992 | Murakami | 307/597 |
| 5,175,454 | 12/1992 | Murakami | 307/597 |
| 5,184,027 | 2/1993 | Masuda et al. | 307/269 |
| 5,204,559 | 4/1993 | Deyhimy | 307/597 |
| 5,231,319 | 7/1993 | Crafts | 307/603 |
| 5,283,631 | 2/1994 | Koerner | 307/597 |
| 5,287,025 | 2/1994 | Nishimichi | 307/603 |

FOREIGN PATENT DOCUMENTS

| | | |
|---|---|---|
| 63-106816 | 5/1988 | Japan . |
| 2-168308 | 6/1990 | Japan . |
| 2-254809 | 10/1990 | Japan . |
| WO91/10951 | 7/1991 | WIPO . |

*Primary Examiner*—William L. Sikes
*Assistant Examiner*—Teep H. Nguyen
*Attorney, Agent, or Firm*—Fay, Sharpe, Beall, Fagan, Minnich & McKee

[57] ABSTRACT

A variable delay circuit including delay devices each having a plurality of delay units connected successively, only some of the delay units of the delay devices being connected to a signal transmission line, wherein a delay time is controlled by activating or inactivating the plurality of delay units according to control signals applied to control input terminals provided respectively for said plurality of delay units. A clock signal supply device for supplying a second clock signal to a logic circuit block, said clock signal supply device having a clock signal generator for generating a first clock signal and a reference signal and a phase adjusting means for adjusting the phase of the first clock signal phased on a phase difference between the first clock signal and the reference signal and outputting the phase-adjusted signal as a second clock signal, wherein the phase adjusting unit comprises a first variable delay circuit capable of delay operation in initial adjustment of the first clock signal, a second variable delay circuit, disposed in series with the first variable delay circuit, for performing the delay operation after the initial adjustment, and control circuits for controlling delay times of the first and second variable delay circuits.

14 Claims, 33 Drawing Sheets

F I G. 1
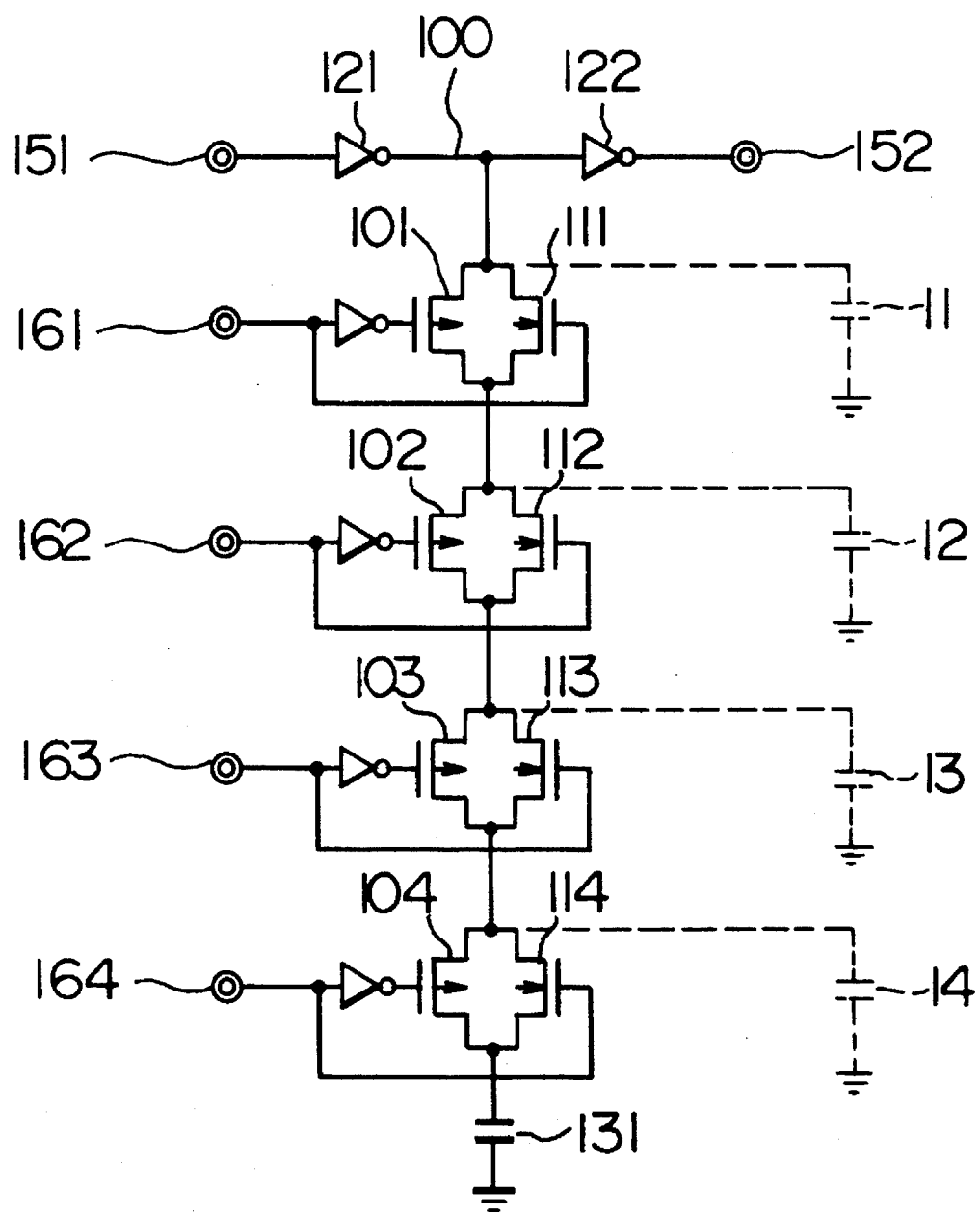

F I G. 2
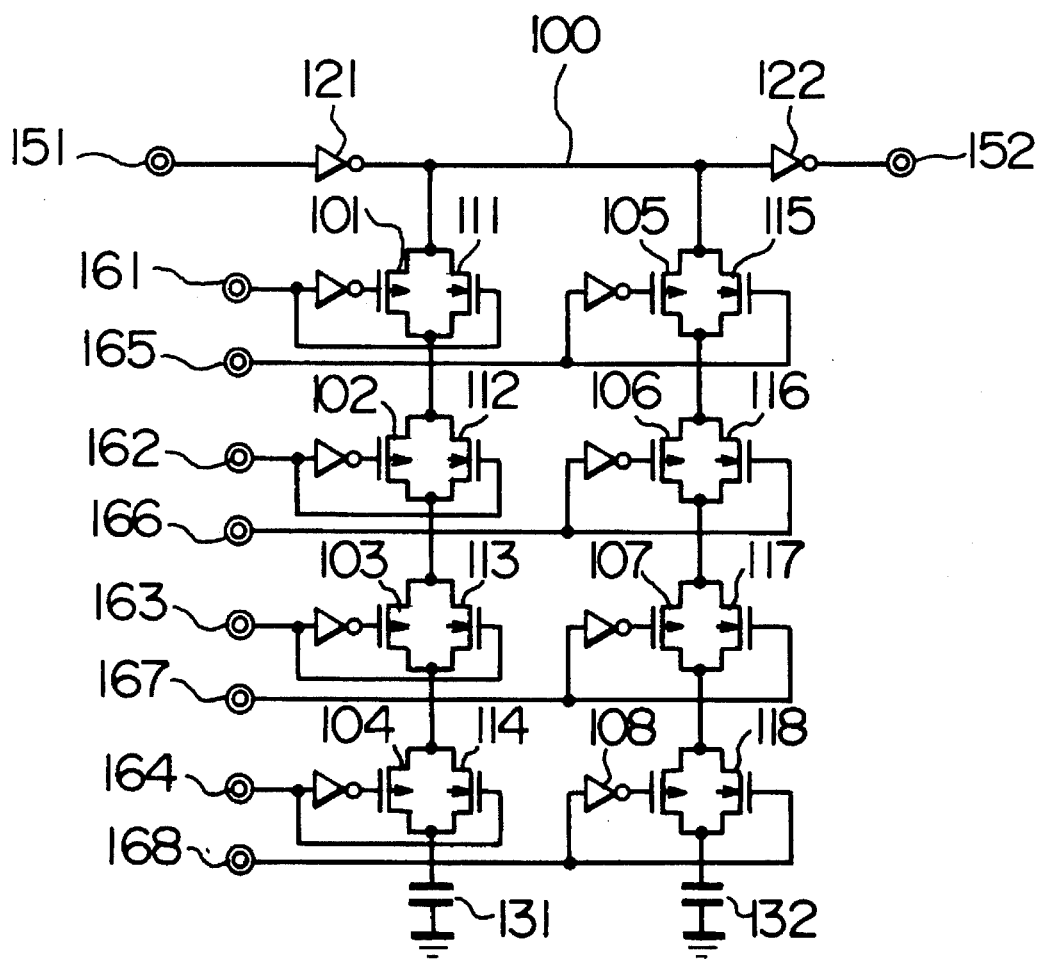

F I G. 8
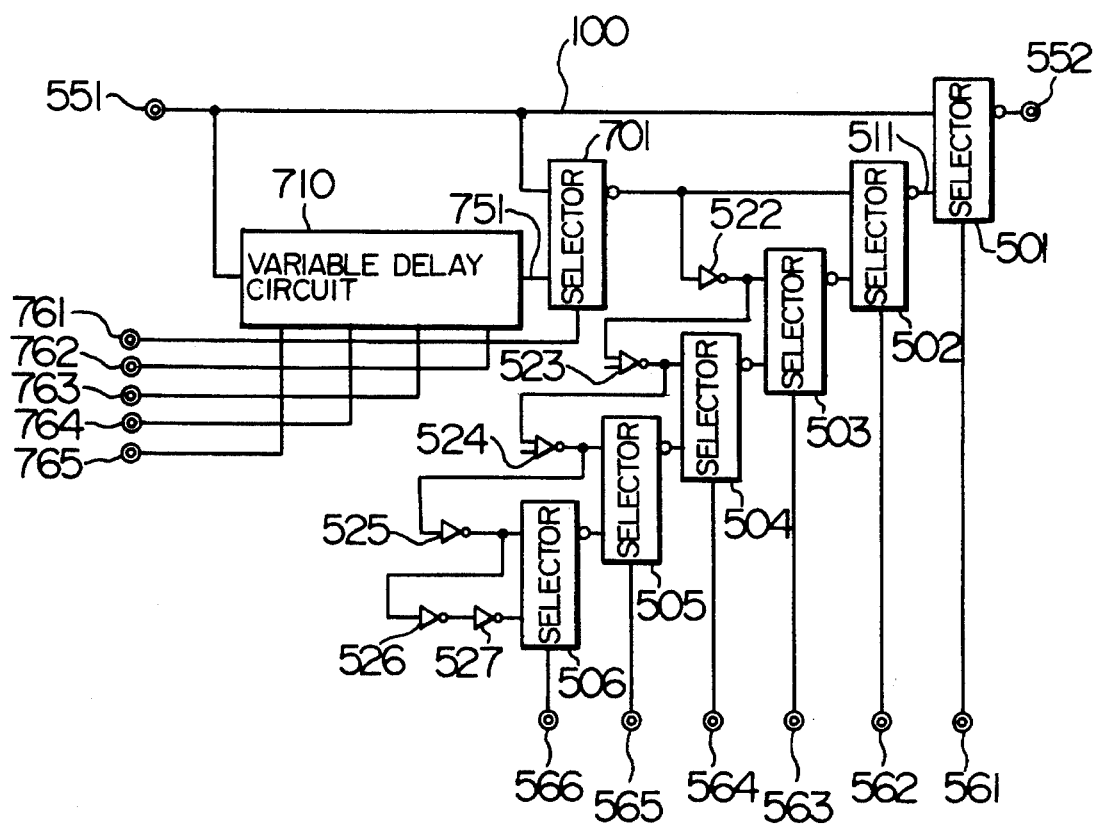

VARIABLE DELAY CIRCUIT AND CLOCK SIGNAL SUPPLY UNIT USING THE SAME

BACKGROUND OF THE INVENTION

This invention relates to a variable delay circuit suitable for use in an information processor such as a computer, and a clock signal supply unit using the same variable delay circuit.

Examples of the clock signal supply unit are disclosed in U.S. Pat. No. 5,184,027 issued on Feb. 2, 1993 and U.S. Pat. No. 5,043,596 issued on Aug. 27, 1991, both assigned to Hitachi Ltd., as is as the present patent application; on JP-A-2-168308, filed on Sep. 13, 1989 by Hitachi Ltd.

In the clock signal supply units disclosed in these publications, a source signal and a reference signal from a clock generator are supplied to destinations which require clock signals. Each destination has a variable delay circuit and uses this variable delay circuit to adjust the source clock signal so as to be in phase with the reference signal.

In order for a clock signal having high phase accuracy to be available for the destinations, it is required to raise the phase accuracy of the reference signal and compare the phases of the clock signal and the reference signal with high accuracy. In the above-mentioned publications, there are revealed reference signal supply circuits and methods as well as phase comparator circuits and methods which meet the above-mentioned requirement.

In JP-A-63-106816, filed on Oct. 24, 1986 by NEC Corporation, there is shown a method for adjusting the phase of the clock signal by a variable delay circuit. In this laid-open publication, no consideration has been made of the automatic phase adjustment for the clock signal, nor the variable range and the resolution in the adjustment of the variable delay circuit.

In JP-A-2-254809, filed on Mar. 28, 1989 by Mitsubishi Electric Corporation, there is shown a method for controlling a delay time by connecting a plurality of transfer gates in the clock signal transmission line and controlling the number of the conducting transfer gates. In this method disclosed in this laid-open publication, if one wishes to increase the phase adjusting range, it is necessary to increase the number of transfer gates directly connected to the clock signal transmission line, which results in an increase in the minimum delay time.

In the phase adjusting device in the conventional clock signal supply unit, immediately after the phase adjustment a clock signal with high phase accuracy can be obtained, but thereafter if the temperature of the device changes, the phase of the clock signal changes, too. Therefore, unless this device is used in a system subject to a limited range of temperature change in steady state (an expensive system equipped with a water cooling device, for example), the phase accuracy deteriorates if there is no means that follows up changes in temperature in controlling the delay time.

JP-A-2-168308 discloses an example of a variable delay circuit which can follow changes in temperature. However, if one wishes to increase the follow-up range of temperature change without coarsening the resolution (a difference between a delay time that occurs when a control signal is applied and a delay time that occurs when this control signal is varied by one step) in delay time control, in this variable delay circuit, it is necessary to increase the stages of selectors, which results in an increase of the minimum delay time (a delay time that is produced by applying such a control signal is applied so as to minimize the delay time of the variable delay circuit). A result of this is an increase in the range of phase change in relation to a given change in temperature. In order to correct this, a wider follow-up range is required. In consequence, when the technique disclosed in JP-A-2-168308 is used to follow up temperature changes, there is no other choice but to coarsen the resolution in phase control to some extent.

In the technique disclosed in JP-A-2-168308, to prevent a spike-like noise from occurring in the clock signal output, flip-flops are used to inhibit the switch-over timing of the selector from being superposed on a rise or a fall of the clock signal. However, for such flip-flops, a high-speed circuit is required which can follow up the frequency of the clock signal.

With a variable delay circuit used in the conventional clock phase adjusting device, increasing the variable range of the variable delay circuit requires an increase in the stages of selectors, resulting in an increase in the minimum delay time. The skew increases' which is attributable to variations in the manufacture of semiconductor devices constituting this variable delay circuit. To correct this, a greater variable range is required. Particularly in a CMOS circuit widely used in a less expensive system, this problem is conspicuous because of the great variations in delay time.

SUMMARY OF THE INVENTION

An object of the present invention is to provide a novel variable delay circuit meeting the conflicting requirements of reducing the minimum delay time as much as possible and obtaining a wider variable range of the delay time, and also to provide a clock signal supply unit using this variable delay circuit.

Another object of the present invention is to provide a novel variable delay circuit capable of varying the delay time without allowing noise to occur while a clock signal is supplied, and additionally to provide a clock signal supply unit using this variable delay circuit.

In the variable delay circuit of the present invention, which includes a delay device having a plurality of delay units connected successively, only some of the delay units of the delay device are connected to the signal transmission line, and in compliance with a control signal given to control input terminals attached respectively to the plurality of the delay units, the plurality of delay units are activated or inactivated to control the delay time.

The clock signal supply device of the present invention comprises a clock signal generator for generating a first clock signal and a reference signal, and a phase adjusting device for adjusting the phase of the first clock signal based on a phase difference between the first clock signal and the reference signal, and outputting this phase-adjusted signal as a second clock signal, wherein the phase adjusting unit includes a first variable delay circuit capable of a delay operation in the initial adjustment of the first clock signal, a second variable delay circuit capable of changing a delay time after the initial adjustment, and control circuits for controlling delay times of the first and second variable delay circuits.

Other objects of the present invention will become apparent from the description made with reference to the following drawings.

BRIEF DESCRIPTION OF THE DRAWINGS

FIG. 1 is a circuit diagram showing an embodiment of a variable delay circuit according to the present invention;

FIG. 2 is a circuit diagram showing another embodiment of a variable delay circuit according to the present invention;

FIG. 8 is a circuit diagram showing an additional embodiment of a variable delay circuit according to the present invention;

DESCRIPTION OF THE PREFERRED EMBODIMENTS

Figure 3:
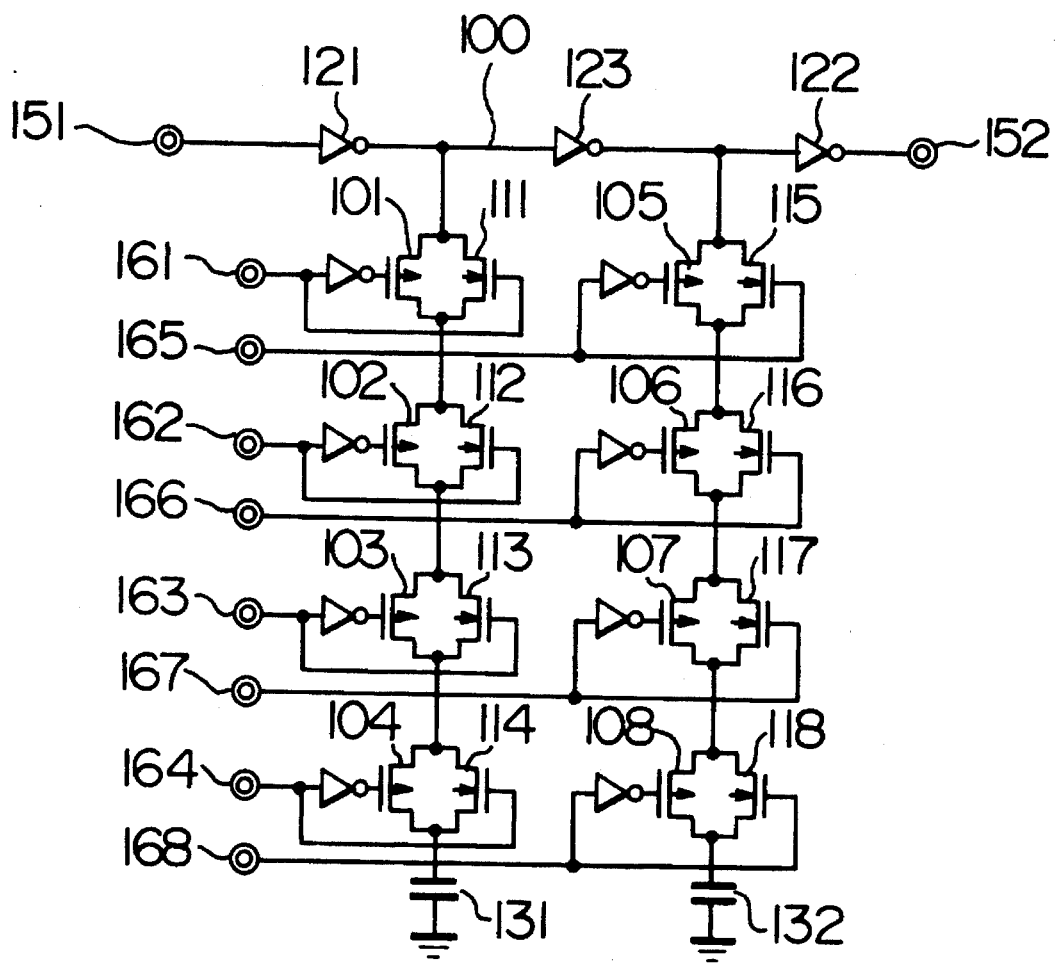
FIG. 3 is a circuit diagram showing a further embodiment of a variable delay circuit according to the present invention.

FIG. 1 shows a first embodiment of the variable delay circuit according to the present invention. In FIG. 1, reference numerals 101 to 104 denote PMOS devices used as transfer gates, 111 to 114 denote NMOS devices used as transfer gates, 121 and 122 denote buffer circuits to prevent effects of waveform distortions due to load variations from being transmitted to other circuits, and 131 denotes a capacitive device constituting a part of the load. Numeral 151 denotes an input terminal of a clock signal, 100 denotes a clock signal transmission line, 152 denotes an output terminal of the clock signal, and 161 to 164 denote control terminals for inputting control signals. When a transfer gate array as shown in FIG. 1 is formed on a common semiconductor substrate, stray capacitances 11, 12, 13, 14 exist at all junctions between PMOS transistors and NMOS transistors as indicated by the dotted lines. When the transfer gates formed by the PMOS transistors and the NMOS transistors are cut off, only the stray capacitance 11 is connected between the signal transmission line 100 and ground. When all the transfer gates are conducting, all the stray capacitances 11, 12, 13, 14 and the capacitor 131 are connected between the signal transmission line 100 and ground. In this circuit, if the control signals applied to the control terminals are all "high", all transfer gates conduct, thus maximizing the load on the buffer circuit 121, and making the signal propagation time from the signal input terminal 151 to the signal output terminal 152 the longest. However, if only the control signal applied to the control terminal 164 is switched to the low level, only the transfer gates 104, 114 are cut off, and as a result, the load on the buffer circuit 121 is lessened by the amount of power consumption corresponding to the drain-side gate capacitances of the MOS devices 104, 114 and the capacitance of the capacitive device 131. Therefore, the signal propagation time from the input terminal 151 to the output terminal 152 is shortened, accordingly.

Similarly, if the control signal applied to the control terminal 163 is switched to the low level, the transfer gates 103, 113 are cut off, and the load on the buffer circuit 121 is further lessened by the amount of power consumption corresponding to the gate capacitances on the source sides of the MOS devices 104, 114. The signal propagation time from the input terminal 151 to the output terminal 152 is further decreased in proportion to the increased reduction of load. Likewise, when the control signal applied to the control terminal 161 is switched to the low level, the signal propagation time from the input terminal 151 to the output terminal 152 becomes the shortest. It ought to be noted here that the signal propagation time at this time is determined only by the basic delay times and the load drive capacity of the buffer circuits 121, 122, the gate capacitances of the MOS devices 101, 111, and the stray capacitance 11, regardless of the number of stages of transfer gates. More specifically, if the circuit in FIG. 1 is used, even though the number of transfer gates is increased to decrease the resolution in delay time control, the minimum delay time can be set at a fixed level, leaving no chances of its increase. Moreover, in the circuit of FIG. 1, no circuit is provided to switch over the clock signal transmission line 100 itself as it was used in the conventional variable delay circuit. Therefore, there is no possibility of a spike-like noise occurring unless the control signals applied to the gate electrodes of the transfer gates 101 to 114 are switched over extremely quickly. Therefore, it is not necessary to provide a control circuit which operates at the same speed as or faster than the buffer circuits 121, 122 through which the clock signal propagates.

Incidentally, the transfer gates can be formed by independent PMOS devices or NMOS devices instead of combinations of PMOS devices and NMOS devices used in the embodiment in FIG. 1. In using combinations of PMOS devices and NMOS devices, there is an advantage that delay characteristics can be obtained which are uniform at the rising and falling edges of a clock pulse. Moreover, the transfer gates need not necessarily be formed by PMOS and NMOS devices only, but can be formed by other switching devices. Generally, the transfer gates can cause the signal line to conduct or cut off bidirectionally by signals applied to the control terminals.

FIG. 2 shows a second embodiment of the variable delay circuit according to the present invention. In FIG. 2, reference numerals 101 to 108 denote PMOS devices used as the transfer gates, 111 to 118 denote NMOS devices used as the transfer gates, 121 and 122 denote buffer circuits to prevent the effects of waveform distortions due to load variations from being transmitted to other circuits, and 131 and 132 denote capacitive devices constituting a part of the load. Numeral 151 denotes a clock signal input terminal, while 152 denotes a clock signal output terminal, and 161 to 168 control terminals for inputting control signals. The circuit in FIG. 2 is formed by arranging in parallel the transfer gates of the circuit of FIG. 1, and this circuit changes the magnitude of the load by opening and closing the transfer gates in the same manner as in the circuit of FIG. 1 to thereby control the delay time. In the circuit in FIG. 1, when the number of stages of transfer gates is increased to more than a certain number, the series resistance of the transfer gates becomes so large that the load remote from the buffer circuit 121 is unable to contribute much to switching over the delay time. In this embodiment, this problem is circumvented by arranging the transfer gates in parallel.

FIG. 3 shows a third embodiment of the variable delay circuit according to the present invention. In FIG. 3, reference numerals 101 to 108 denote PMOS devices used as the transfer gates, 111 to 118 denote NMOS devices used as the transfer gates, 121 and 122 denote buffer circuits to prevent the effects of waveform distortions due to load variations from being transferred to other circuits, 123 denotes a buffer circuit to avoid a decrease in the signal amplitude in this variable delay circuit, and 131 and 132 denote capacitive devices constituting a part of the load. Numeral 151 denotes a clock signal input terminal, while 152 denotes a clock signal output terminal, and 161 to 168 denote control terminals for inputting control signals.

In the circuits shown in FIGS. 1 and 2, if the variable range of delay time is made greater than about ¼ of the period of the clock signal, the output amplitude of the buffer circuit 121 begins to decrease, and if the variable range is made greater than about ½ of the period of the clock signal, the clock signal becomes unable to be transmitted to the buffer circuit 122. In order to circumvent this problem, a buffer circuit 123 is interposed between the buffer circuits 121 and 122. For example, by setting the delay time variable range at ¼ of the period of the clock signal between the buffer circuits 121 and 123, and between the buffer circuits 123 and 122, respectively, the delay time variable range as a whole can be made ½ of the period of the clock signal without causing any large decrease in the signal amplitude in the variable delay circuit. Since the load drive capacity of the buffer circuit 121 generally differs between the rise and fall of the signal, if the load is made heavier in the circuits of the first and second embodiments, the duty ratio of the clock signal changes while the signal propagates from the input to the output of the circuit. In contrast, when the circuit of this embodiment is used, a resulting effect is that the change of the duty ratio can be corrected by substantially equalizing the magnitude of the load before and after the buffer circuit 123.

Figure 4:
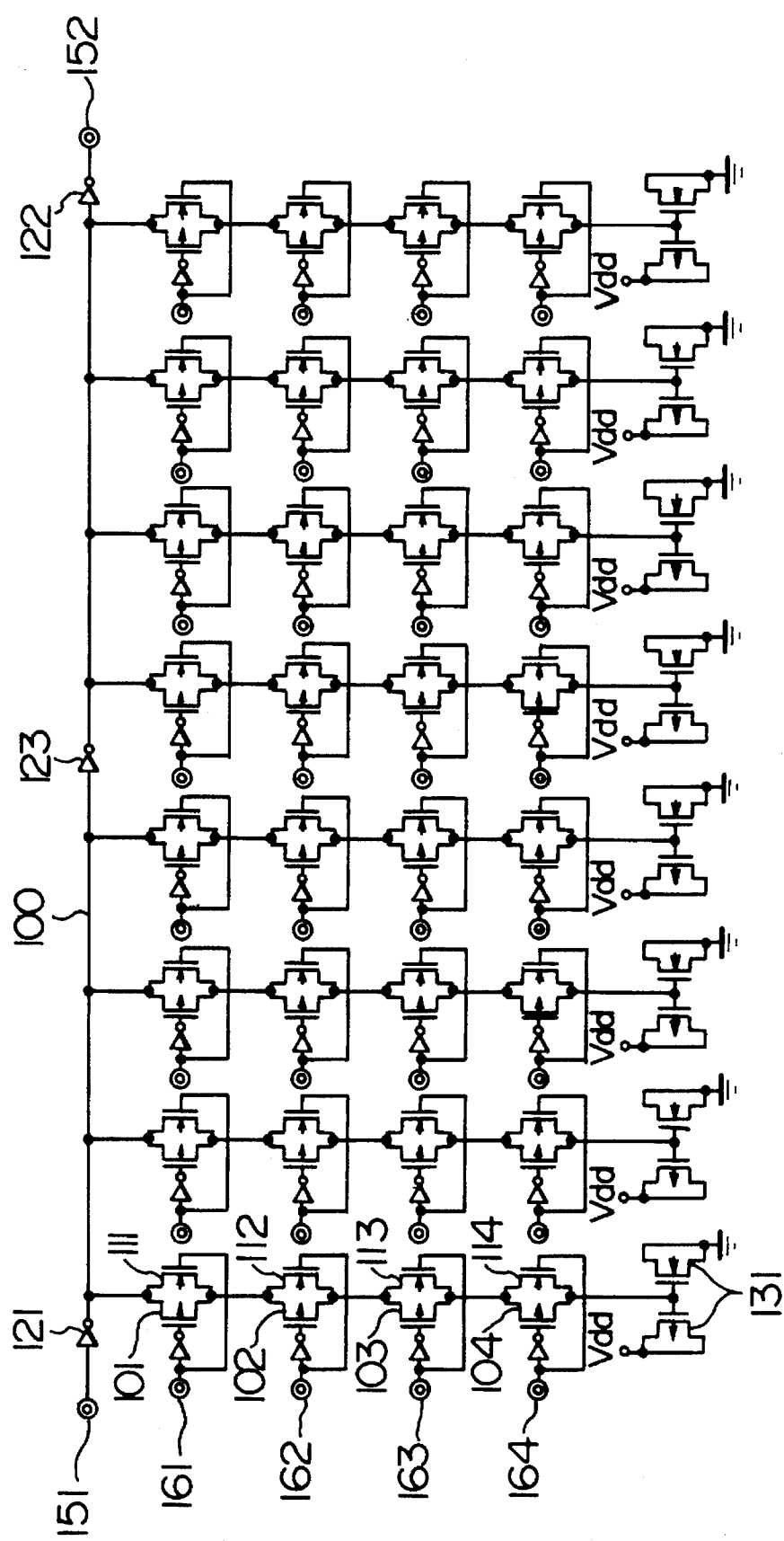
FIG. 4 is a circuit diagram showing yet another embodiment of a variable delay circuit according to the present invention.

FIG. 4 shows a fourth embodiment of the variable delay circuit according to the present invention, which is a combination of the circuit of FIG. 2 with the circuit of FIG. 3. To be more specific, a buffer circuit 123 is disposed between the buffer circuits 121 and 122, and as the load, the buffer circuits 121 and 123 are connected with multiple gate arrays, arranged in parallel, each gate array including a plurality of transfer gates connected in series. As shown in FIG. 4, in this embodiment, each capacitive device 131 comprises a MOS device with the source and drain electrodes connected to a power source and a MOS device with the source and drain electrodes connected to the ground. Also, it is possible to obtain a variable delay circuit with a greater variable range by making ready a plurality of variable delay circuits as shown in FIGS. 1 to 4, and connecting them in as many stages as desired.

According to the embodiments of the present invention shown in FIGS. 1 to 4, by controlling the transfer gates connected to the buffer circuits in the clock signal transmission line 100, the load on the buffer circuits is changed to vary the delay time. Thus, it becomes possible to finely set the resolution in delay time control without increasing the minimum delay time. And, since there is no need to temporarily cut off the clock signal transmission line 100 itself when varying the delay time, a spike noise or the like does not occur attending a change of delay time.

Figure 5:
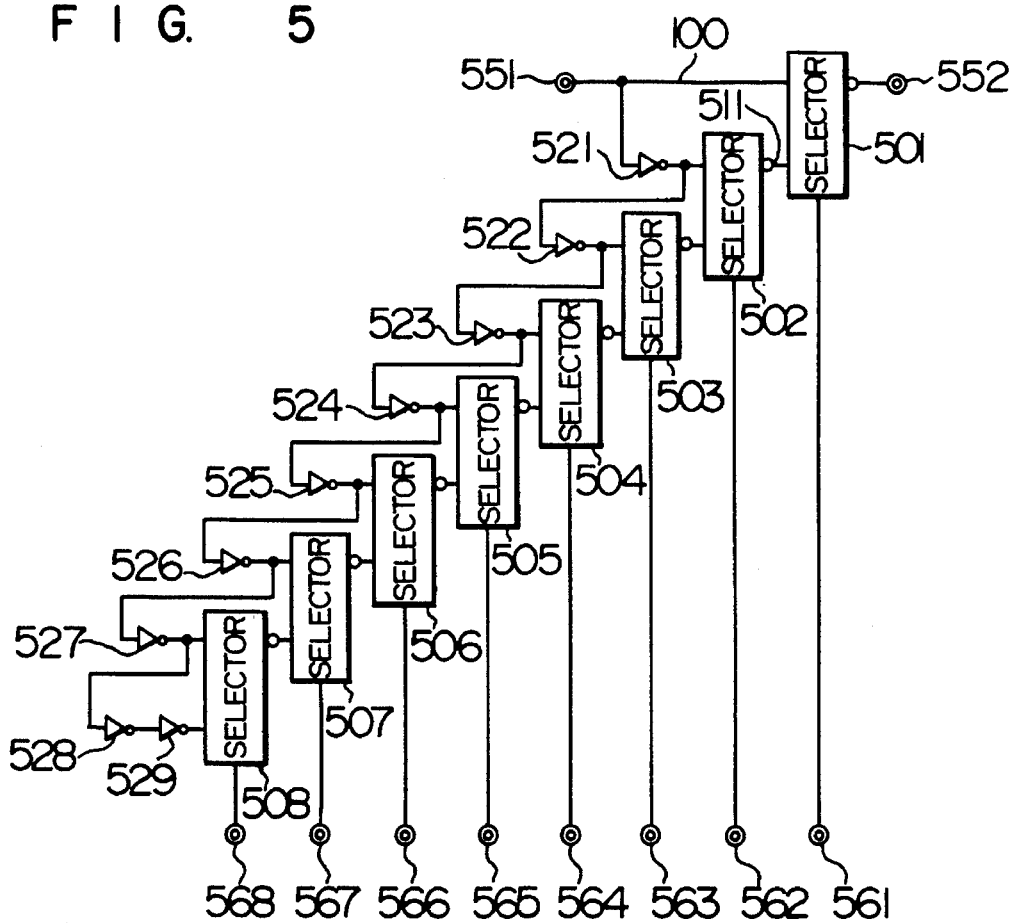
FIG. 5 is a circuit diagram showing a still further embodiment of a variable delay circuit according to the present invention.

FIG. 5 shows a fifth embodiment of the variable delay circuit according to the present invention. In FIG. 5, reference numerals 501 to 508 denote selector circuits, and 521 to 529 denote inverter circuits for setting the polarities of the clock signal. Numeral 551 denotes an input terminal of a clock signal, 552 denotes an output terminal of the clock signal, and 561 to 568 denote control terminals for inputting control signals.

In this embodiment, when all selector circuits receive control signals that cause them to select the inputs on the lower side shown in FIG. 5 (the node 511 for the selector circuit 501, for example), a clock signal applied to the input terminal 551 passes through all inverter circuits and all selector circuits, and is output to the output terminal 552. The variable delay circuit set in this state produces the maximum delay time. At this time, if the control signal applied to the control terminal 568 is switched over, the selector circuit 508 selects a signal from the inverter 527, so that a signal which does not pass through the inverters 528, 529 is output. Therefore, the signal propagation time is reduced by delay times of the inverter circuits 528, 529.

In addition, if the control signal applied to the control terminal 567 is switched over, the selector circuit 507 selects a signal from the inverter circuit 526, a signal which does not pass through the inverter circuit 527 and the selector circuit 508 is output. Consequently, the signal propagation time is further reduced accordingly. Similarly, if the control signal applied to the control terminal 561 is switched over, a signal which passes through no circuit other than the selector circuit 501 is output. At this time, the signal propagation time from the input terminal 151 to the output terminal 152 is determined only by the delay time of the selector circuit 501 regardless of the number of selector circuits, and is, in other words, the shortest. More specifically, according to this embodiment, by selecting as the channel of a clock signal either a channel of a fixed delay time or a channel of a variable delay time, it is possible to arbitrarily design the maximum delay time without increasing the minimum delay time.

Figure 6:
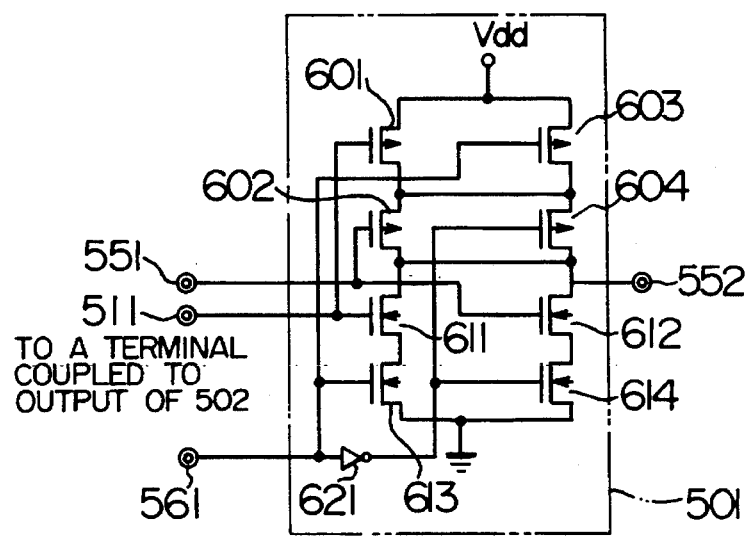
FIG. 6 is a circuit diagram showing an example of a selector circuit used in a variable delay circuit according to the present invention.

FIG. 6 is a circuit diagram showing an example of a selector circuit 501 as a component part of the delay circuit in FIG. 5. In FIG. 6, reference numerals 601 to 604 denote PMOS devices, 611 to 614 denote NMOS devices, and 621 denotes an inverter circuit. Numeral 551 denotes a clock signal input terminal, 552 denotes a clock signal output terminal, 561 denotes a control terminal for inputting a control signal, 511 denotes a terminal to be connected to the output of the selector circuit 502 in FIG. 5, and Vdd denotes a terminal connected to a power source of a positive polarity. In this selector circuit, when a low-level control signal is applied to the control terminal 561, the PMOS device 604 and the NMOS device 613 are cut off, and the PMOS device 603 and the NMOS device 614 are put into the conducting state. Therefore, the signal which appears at the output terminal 552 is determined by the states of the PMOS device 602 and the NMOS device 612.

In other words, a signal of a polarity inverted with respect to the polarity of the signal applied to the input terminal 551 appears at the output terminal 552. This is not affected by the signal applied to the input terminal 511. Conversely, if a high-level control signal is applied to the control terminal 561, the PMOS device 603 and the NMOS device 614 are cut off, and the PMOS device 604 and the NMOS device 613 are put into conduction. In this case, a signal of an inverted polarity of the polarity of the signal applied to the input terminal 511 appears at the output terminal 552, and this is not affected by a signal applied to the input terminal 551. In this manner, the circuit 501 shown in FIG. 6 operates as a selector circuit.

Figure 23:
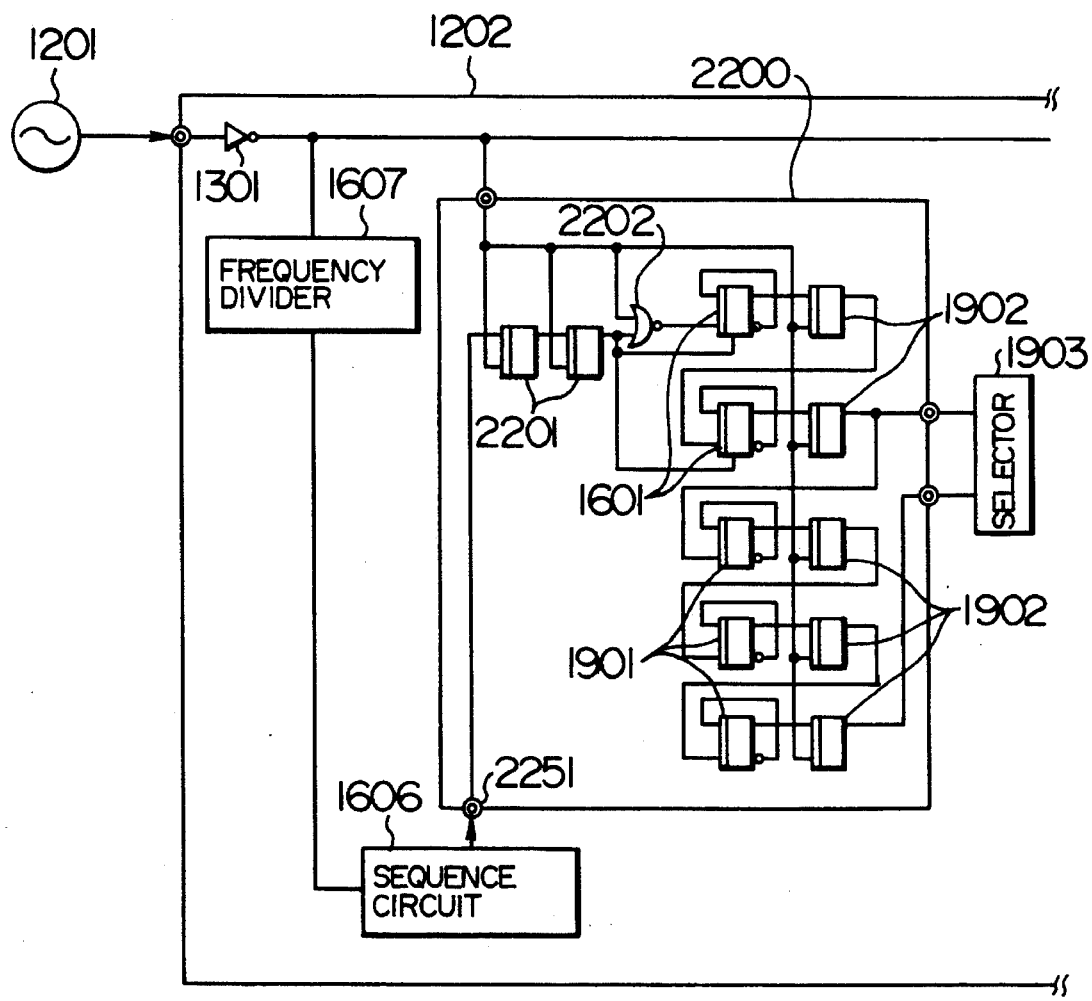
FIG. 23 is a circuit diagram showing an embodiment of a part of the circuit of FIG. 22.

The other selector circuits in FIG. 5 can be formed in the same circuit configuration. When clock signals are sent by transmission of differential signals of opposite polarity, a selector circuit such as shown in FIG. 23 in JP-A-2-168308 can be used. Note that when clock signals are sent in the differential signal transmission, the inversion or noninversion of the polarity can be set freely only by a way of connection, and therefore, obviously, the inverter circuits 521 to 528 in FIG. 5 become unnecessary.

Figure 7:
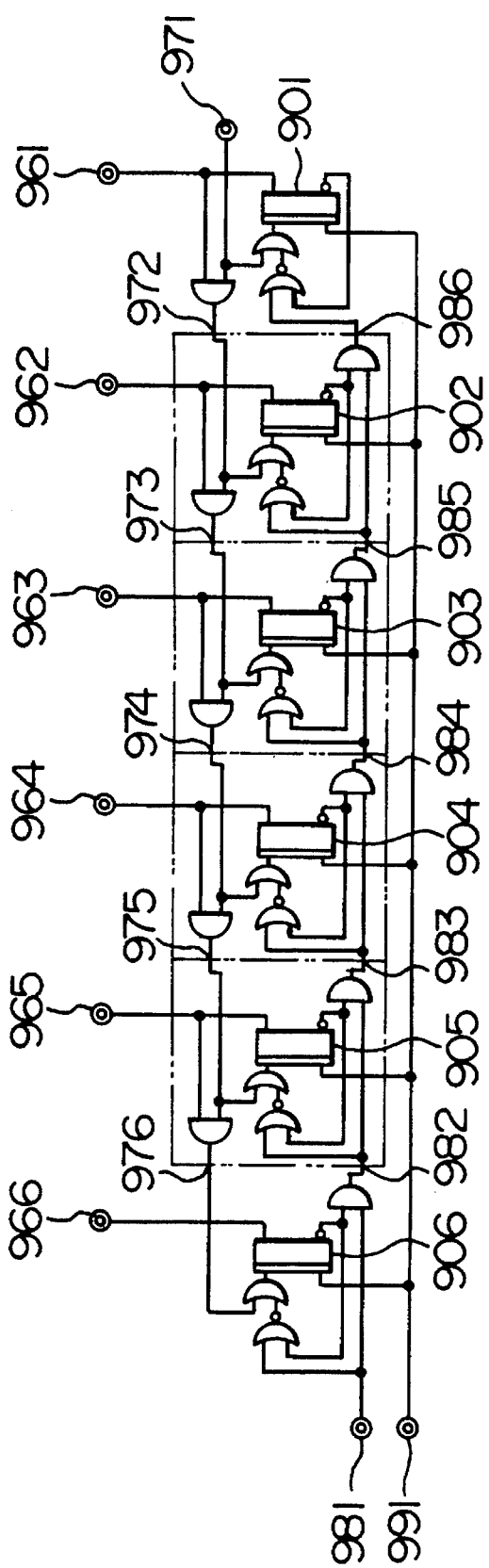
FIG. 7 is a circuit diagram showing an embodiment of a control circuit for controlling a variable delay circuit according to the present invention.

FIG. 7 shows an embodiment of a control circuit for generating a control signal applied to the variable delay circuits in the first to fifth embodiments described above.

In FIG. 7, reference numerals 901 to 906 denote flip-flop circuits. Numerals 961 to 966 denote output terminals of control signals applied to the variable delay circuit. To control the delay time in the variable delay circuits in FIGS. 1 to 4, output terminals 961 to 966 are connected to the control terminals 161 to 166, and to control the delay time of the variable delay circuit in FIG. 5, the output terminals 961 to 966 are connected to the control terminals 561 to 566.

Numeral 971 denotes a terminal for inputting an UP signal to increase the delay time, while 981 denotes a terminal for inputting a DOWN signal to decrease the delay time, and 991 denotes a terminal for inputting, for example, a clock signal of a low frequency, to operate this control circuit. In this control circuit, when low-level signals are applied to the terminals 971 and 981, signals which appear at the internal nodes 972 to 976 and 982 to 986 are all "low". Then, the signals applied to the inputs of the flip-flop circuits 901 to 906 are the same as the signals appearing at the terminals 961 to 966. Even if a clock signal is applied to the terminal 991, the states of all flip-flop circuits are held as they were.

Next, let us consider a case where a high-level signal is applied to the terminal 971 while the terminal 981 is at the low level. Suppose that, for example, a high level is present at the output terminals 961 to 963, and a low level at the output terminal 964. At this time, the signals that appear at the internal nodes 972 to 974 are "high", and the signals that appear at the internal nodes 975, 976 are "low". Under this condition, if a clock signal is applied to the terminal 991, the signal appearing at the output terminal 964 changes from "low" to "high", and the signals appearing at the output terminals 961 to 963 remain at the high level. The signals appearing at the output terminals 965 to 966 are held as they were.

To be more specific, if a high-level signal is applied to the terminal 971 with the terminal 981 at the low level, every time a clock signal is applied to the terminal 991, only the low-level signal at the rightmost terminal in the output terminals 961 to 966 changes to the high level, with the other outputs being held as they were. Likewise, if a high-level signal is applied to the terminal 981 with the terminal 971 at the low level, every time a clock signal is applied to the input terminal, 991 only the high level signal at the leftmost terminal in the output terminals 961 to 966 changes to the low level, with the other outputs being held as they were. Therefore, if the signals appearing at the output terminals are given as control signals for any of the variable delay circuits shown in FIGS. 1 to 5, the variable delay circuit operates as follows: when a high-level signal is applied to the terminal 971, every time a clock signal is applied to the terminal 991, the delay time is prolonged, whereas when a high-level signal is applied to the terminal 981, every time a clock signal is applied to the terminal, 991 the delay time is shortened. Because the output signal of the FIG. 7 circuit changes bit by bit, when this circuit is used to control any of the variable delay circuits, there is no worry that a change of delay time greater than the minimum resolution should occur all at once. Incidentally, through FIG. 7 shows a case where control signals have six bits, by increasing or decreasing the number of stages encircled by the dotted line, the number of bits as control signals can be increased or decreased as desired.

FIG. 8 shows a sixth embodiment of the variable delay circuit according to the present invention. As will be described later, the circuit in FIG. 5 is inconvenient in that the number of devices constituting the control circuit increases in proportion to the number of setting values of the delay time. This embodiment has been made to compensate for the inconvenience, and is designed such that the circuit operates in the same way as the circuit in FIG. 5 when a desired delay time is close to the minimum delay time, and the circuit also uses a conventional variable delay circuit having a simple control circuit when the delay time is to be prolonged.

In FIG. 8, reference numerals 501 to 506 and 701 denote selector circuits, 522 to 527 denote inverter circuits to set the polarities of the clock signal, 551 denotes a clock signal input terminal, 552 denotes a clock signal output terminal, and 561 to 566 and 761 to 765 denote control terminals for inputting control signals. Reference numeral 710 denotes a variable delay circuit employing a simple control method, and (for example) a variable delay circuit shown in FIG. 9 can be used for this purpose. In this embodiment, the number of stages of selector circuits 501 to 506 is set so that the total of delay times at the selector circuits 503 to 506 and the inverter circuits 522 to 527 is equal to or longer than the minimum delay time of the variable delay circuit and the resolution in delay time control.

The circuit in this embodiment operates in the same way as in the circuit of FIG. 5 when a control signal is applied to the control terminal 761 so as to select the input on the side directly connected to the input terminal 551. On the other hand, when a control signal to cause the selector circuit 701 to select the output of the variable delay circuit 710 (the node 751) is applied to the control terminal 761 and another control signal to cause the selector circuit 501 to select the output (the node 511) of the selector circuit 502 is applied to the control terminal 561, the delay time of the variable delay circuit (710) is added. In other words, in this embodiment, when the selector circuit 501 selects a signal from the input terminal 551, the delay time is the shortest, that is, the delay time is only that of one stage (the selector circuit 501). This delay time is the same as the minimum delay time of the circuit in FIG. 5.

On the other hand, the maximum delay time is a total of the delay times of all the circuits constituting the delay circuit (with the variable delay circuit 710 producing its maximum delay time), so that there are no useless components which do not contribute to producing the maximum delay time. The resolution in delay time control is the sum of the delay times of two stages (701 and 502) of the selector circuits, or the sum of the delay times of any one stage of selector circuit and an inverter circuit (503 and 522, for example), or the sum of two stages (526 and 527) of the inverter circuit, and this resolution is substantially the same as the resolution of the circuit in FIG. 5.

As mentioned above, the maximum delay time determined by the selector circuits 503 to 506 and the inverter circuits 522 to 527 is to have been set to be equal to or longer than the minimum circuit of the variable delay circuit 710, and therefore, the variable ranges of delay time before and after changing over the selector circuit 701 have an overlapping range. This applies to a case where the delay time is increased in steps. Consequently, it never occurs that the resolution of delay time control exceeds any of the above-mentioned three lengths of the resolution.

Figure 9:
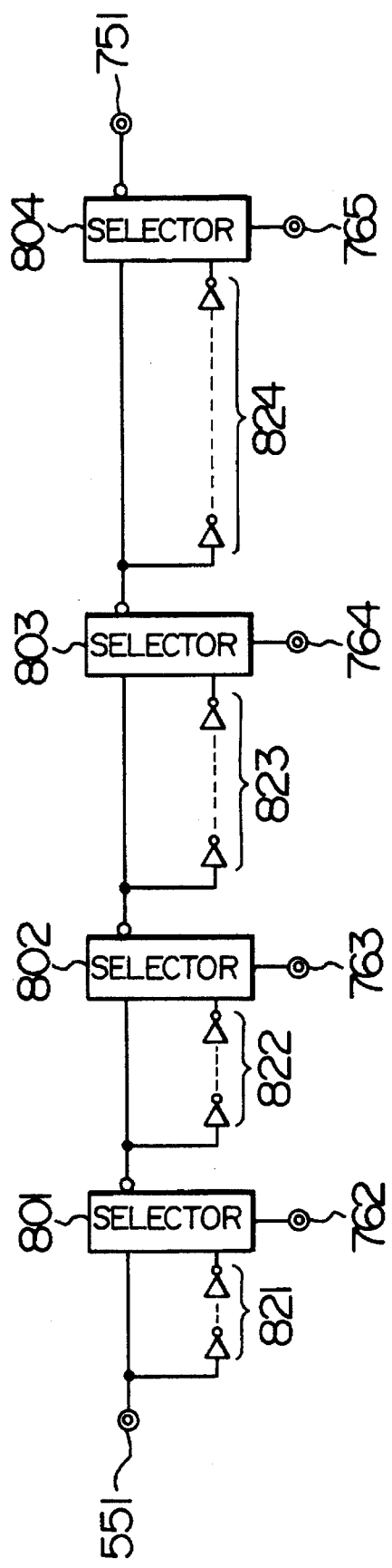
FIG. 9 is a circuit diagram showing an example of a variable delay circuit used as a part of the circuit of FIG. 8.

FIG. 9 shows an example of the construction of the variable delay circuit 701. In FIG. 9, reference numerals 801 to 804 denote selector circuits, and 821 to 824 denote inverter circuits for producing delay time differences. Those parts common with FIG. 5 are designated by the same reference numerals.

In the circuit in FIG. 9, by the control signals applied to the control terminals 762 to 765 of the selector circuits 801 to 804, it is possible to select either a channel of a short delay time (a sum of delay times of only the selector circuits) or a channel of a longer delay time (a sum of delay times of the selector circuits plus the inverter circuits). If the delay time of the inverter circuits 822 is set to be a little smaller than twice the delay time of the inverter circuits 821; if the delay time of the inverter circuits 823 is set to be a little smaller than about twice the delay time of the inverter circuits 822; and if the delay time of the inverter circuits 824 is set to be a little smaller than about twice the delay time of the inverter circuits 823, the delay time of the variable delay circuit 710 can be selected freely by adequately setting control signals at the terminals 762 to 765 with the delay time of the inverter circuits 821 as the minimum resolution. Note that the minimum delay time of this circuit is a sum of the delay times of the selector circuits 801 to 804, and that the maximum delay time is a sum of the delay times of the inverter circuits 821 to 824 added with the sum of the delay times of the selector circuits 801 to 804.

Figure 10:
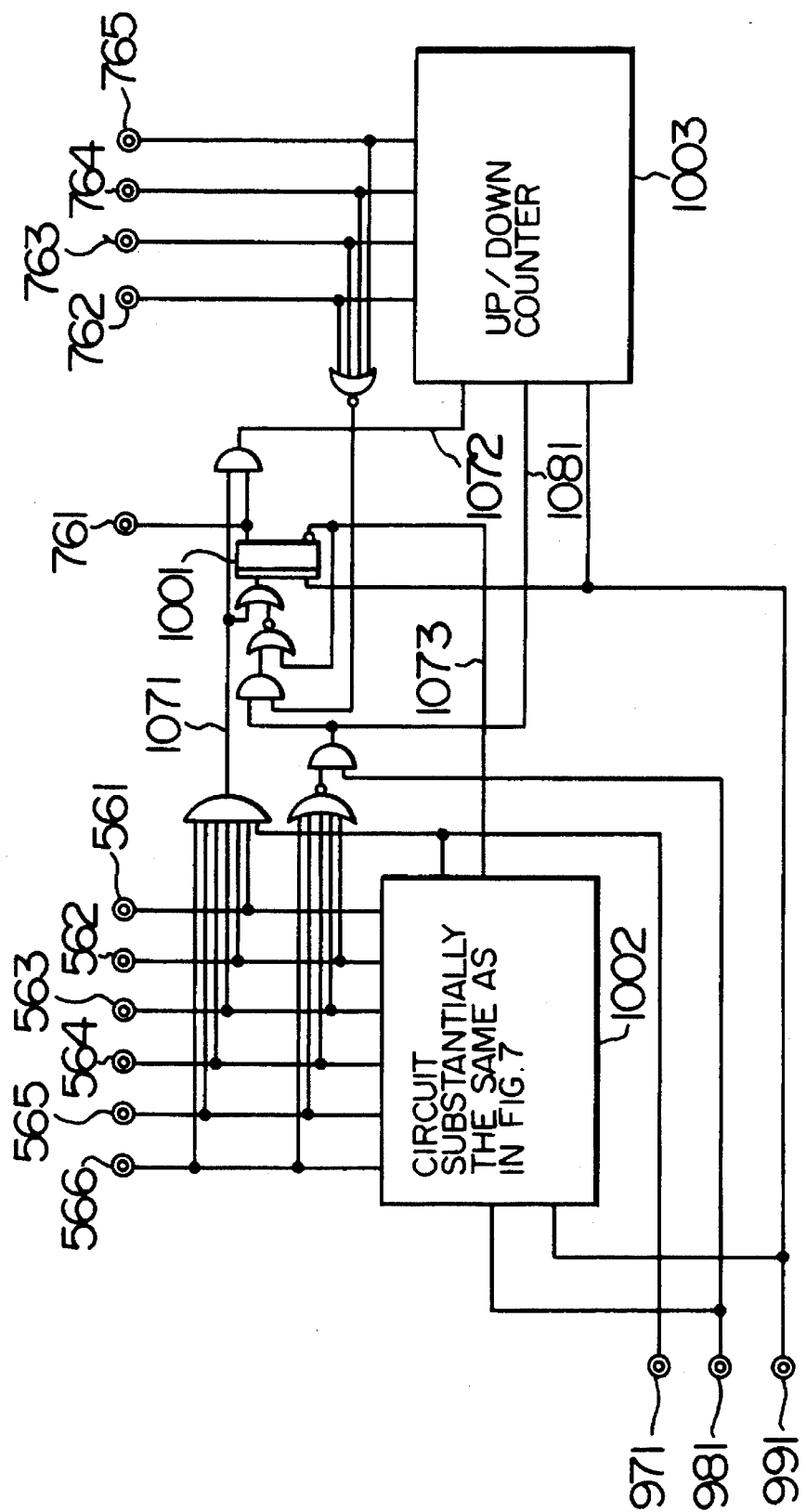
FIG. 10 is a circuit diagram showing another embodiment of a control circuit for controlling a variable delay circuit according to the present invention.

FIG. 10 shows an embodiment of the control circuit for generating control signals supplied to the variable delay circuit of the sixth embodiment shown in FIG. 8. In FIG. 10, reference numeral 1001 denotes a flip-flop circuit, 1002 denotes a circuit with almost the same configuration as in FIG. 7, and 1003 denotes an UP/ DOWN counter. Reference numerals 561 to 566 and 761 to 765 denote output terminals of control signals applied to the variable delay circuit in FIG. 8, and are connected to the control terminals 561 to 566 and 761 to 765 of the circuit in FIG. 8. Reference numerals 971, 981 denote terminals for inputting signals to increase or decrease the delay time, and 991 denotes a terminal for inputting a low-frequency clock signal, for example, to operate this control circuit.

Figure 11A:
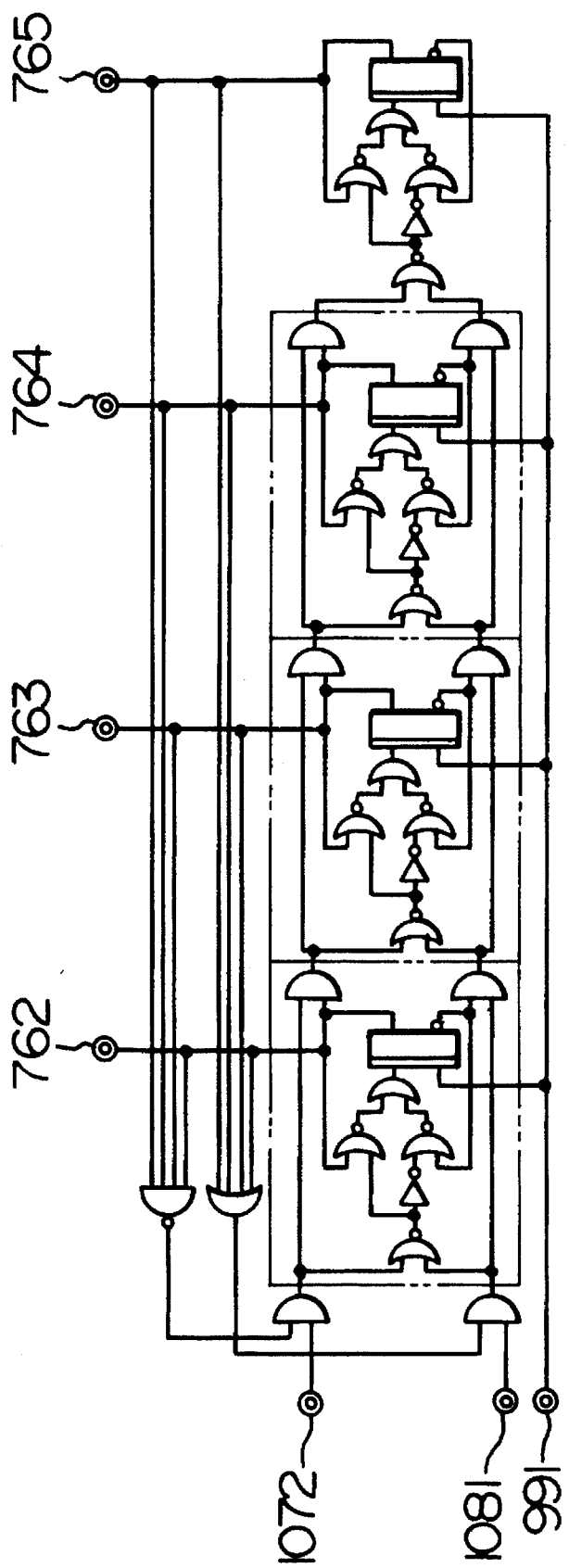
FIGS. 11A and 11B are circuit diagrams showing embodiments of parts of the circuit of FIG. 10.

FIG. 11A shows an example of the UP/DOWN counter 1003. In FIG. 11A, the parts common with FIG. 10 are designated by the same reference numerals. In this circuit, when the inputs to nodes 1072 and 1081 are "low", the signals output to output terminals 762 to 765 do not change, but when the input to the node 1072 is "high" and the input to the node 1081 is "low", every time a clock signal is applied to the terminal 991, a binary number with its binary digits appearing at the output terminals 762 to 765 is incremented by one count, or bit. Conversely, if the input to the node 1072 is "low" and the input to the node 1081 is "high", the binary number is decremented each time a clock signal is applied. This counter is arranged such that when the outputs at the output terminals 762 to 765 are all "high", a signal applied to the node 1072 is suppressed. Likewise, when the outputs are all "low", a signal applied to the node 1081 is suppressed. This arrangement prevents malfunctioning attending an overflow or an underflow.

Figure 11B:
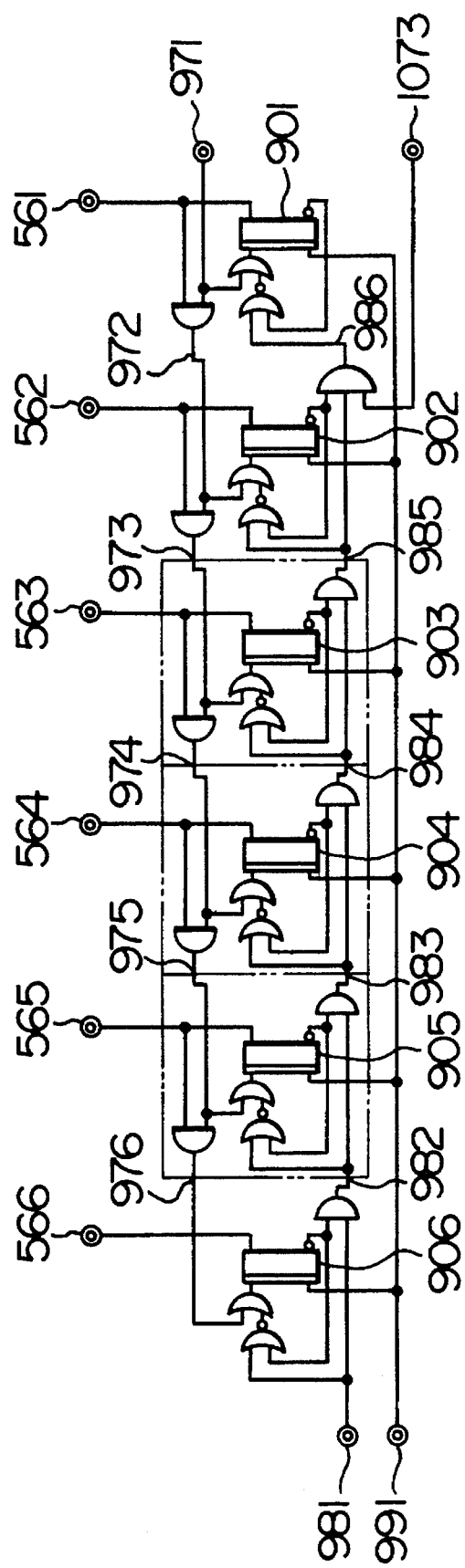

FIG. 11B shows the circuit 1002 configured almost in the same way as the circuit in FIG. 7. In FIG. 11B, the parts common with FIGS. 7 and 10 are designated by the same reference numerals. The important difference in the circuit 1002 from the circuit in FIG. 7 is the condition for the signal to be output to the output terminal 561 to change from the high level to the low level. In the circuit 1002, only when the node 1073 is at the high level (accordingly, the output signal at the output terminal 561 is at the low level), can the signal output from the output terminal 561 go from the high level to the low level.

In FIG. 10, while a low-level signal is applied to the terminals 971 and 981, the control signals output to the output terminals 561 to 566 remain unchanged as in the case of FIG. 7. In this case, the internal nodes 1071, 1072, 1081 are all at the low level, and the control signals output to the output terminals 761 to 765 do not change.

Let us now consider a case where the signal applied to the terminal 971 is set at the high level with the terminal 981 held at the low level. At this time, if any one of the output terminals 561 to 566 is "low", the internal nodes 1071, 1072, 1081 are all held at the low level, and the signals output to the output terminals 761 to 765 remain unchanged, but the signals output to the output terminals 561 to 566 change as in the case of FIG. 9. When the output at the output terminal 761 is at the low level, if the output terminals 561 to 566 all go to the high level, of the moment a clock signal is applied to the terminal 991, the output terminal 761 changes to the high level. At this time, the signals output to the terminals 762 to 765 do not change. When the signals output to the output terminals 561 to 566 and 761 all go to the high level, every time a clock signal is applied to the terminal 991, binary digits output to the terminals 762 to 765 are incremented by one bit each time a clock signal, from the next clock signal on, is applied to the terminal 991. Then, when the signals output to the output terminals 561 to 566 and 761 to 765 go to the high level, the output signals do not change further.

Next, let us consider a case where a signal applied to the terminal 981 is set to the high level while the terminal 971 remains at the low level. At this time, if any one of the signals output to the output terminals 562 to 566 is at the high level, the internal nodes 1071, 1072, 1081 remain all at the low level, and the signals output to the output terminals 761 to 765 do not change. At this time, only the signals output to the output terminals 761 to 765 change as in FIG. 9.

When the signals output to the output terminals 562 to 566 all go to the low level, the internal node 1081 goes to the high level regardless of the states of the output terminals 561 and 761. Therefore, each time a clock signal, from the next clock signal on, is applied to the terminal 991, its binary digits output to the output terminals 762 to 765 decrement by one. The signal output to the output terminal 761 does not change so long as any one of the output terminals 762 to 765 is at the high level, but when the output terminals 762 to 765 and 562 to 566 all go to the low level, when the next clock signal is applied, if the signal appearing at the output terminal 761 at this time is at the high level, the output terminal 761 goes to the low level. The output terminal 561 remains unchanged while the output terminal 761 is at the high level, but when the output terminals 761 and 562 to 566 all go to the low level, the moment a clock signal is applied next, the output terminal 561 goes to the low level. And, when the signals output to the output terminals 561 to 566 and 761 to 765 all go to the low level, the output signals do not change further. In this way, control signals are changed until a desired delay time is obtained by suitably changing over the signals applied to the terminals 971 and 981.

If the variable delay circuit in FIG. 8 is controlled by using the circuit described above, when the variable delay circuit 710 as a component part is used, this variable delay circuit 710 is first connected, and then the delay time is increased; when this variable delay circuit 710 is disconnected, it is disconnected after the delay time is set to the minimum.

By comparing the circuits of FIGS. 7 and 11A, it will be understood that the circuit in FIG. 7 controls the delay time with six bits in seven steps (n + 1 steps for n bits), while the circuit in FIG. 11A can control the delay time with four bits in 16 steps (the n-th power of 2 steps for n bits). The size of the circuit for one bit is almost the same for the circuit of FIG. 9 and the circuit of FIG. 11A (the amount of materials of the flip-flop circuits occupies a greater part), and therefore, for control in multiple steps, the circuit of FIG. 11A is more preferable because of its small size. However, if one attempts to control the variable delay circuit such as in FIG. 5 by the circuit of FIG. 11A, a complicated decoder is required. Therefore, by controlling the variable delay circuit such as shown in FIG. 8 by a control circuit made up of a combination of both circuits as shown in FIG. 10, it is possible to realize a variable delay circuit having the advantage of the circuit in FIG. 5 without greatly increasing the size of the circuit.

Description will now be made of a clock phase adjusting device used in a computer system as an example of application of the variable delay circuit described above.

Figure 12:
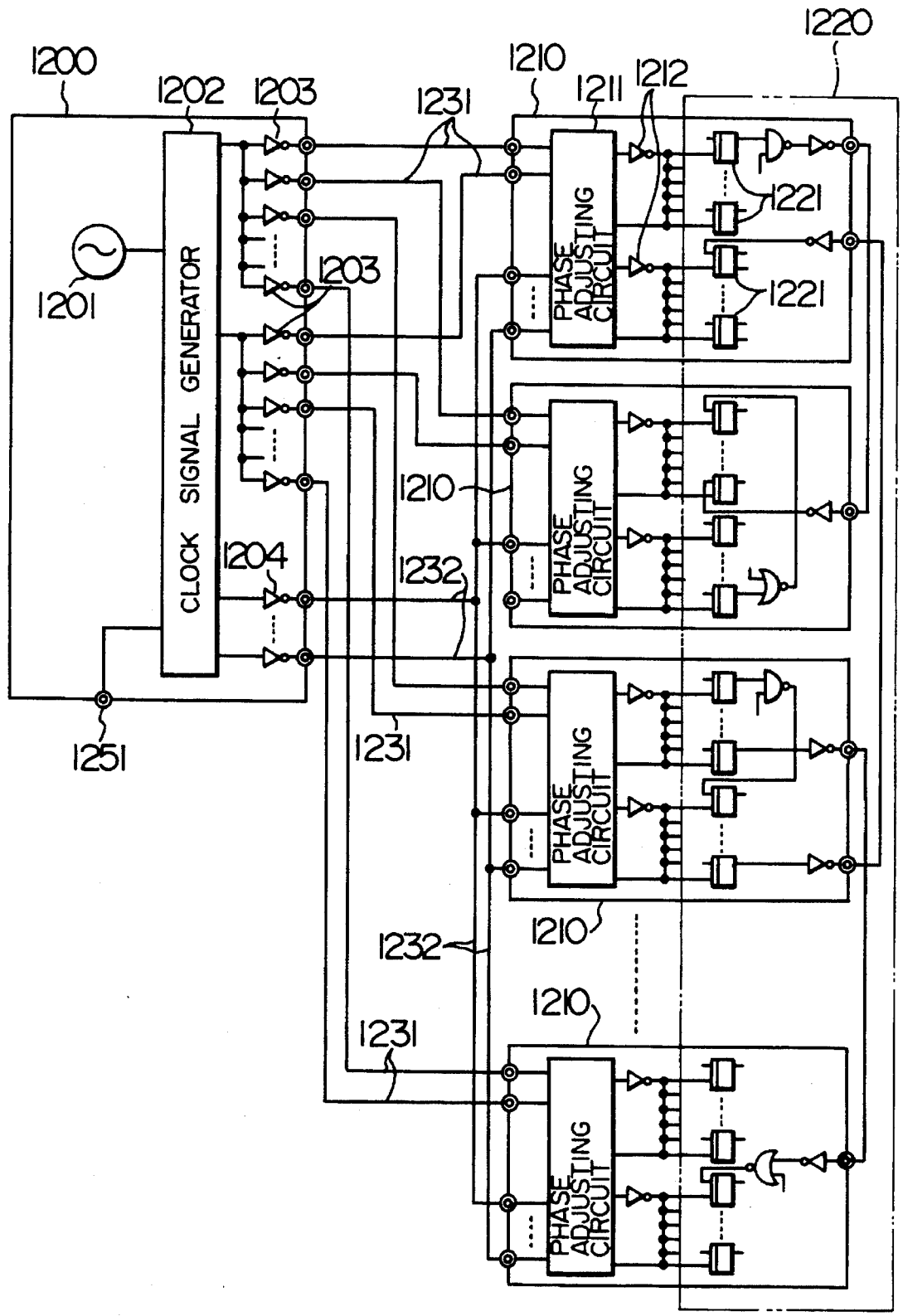
FIG. 12 is a circuit diagram showing an embodiment of a clock phase adjusting device according to the present invention.

FIG. 12 is a block diagram showing an embodiment of the clock phase adjusting circuit used in a computer. In FIG. 12, reference numeral 1200 denotes a clock signal supply source, and 1210 denotes clock signal destinations. Reference numeral 1220 denotes logic circuits for information processing or the like by using a clock signal, and are disposed across the destinations of the clock signal. Reference numeral 1201 in the clock signal supply source 1200 denotes a high frequency oscillator for generating a high frequency signal as the source of the clock signal, 1202 denotes a clock signal generator circuit for generating a clock signal and a reference signal from a high frequency signal produced by the high frequency oscillator 1201, 1203 denotes buffer circuits for sending a clock signal and a reference signal to the respective destinations 1210, and 1231 denotes wires for sending a clock signal and a reference signal to the destinations 1210. Reference numeral 1211 denotes phase adjusting circuits for adjusting the phase of the clock signal by using the reference signal, and the above-mentioned variable delay circuit is used in each of these circuit. Reference numeral 1212 denotes buffer circuits for sending the phase-adjusted clock signal to the logic circuits 1220.

In order for this circuit to generate a reference signal and adjust the phase, sequence signals are required to determine a reference signal to send and the variable delay circuit to adjust for the phase adjustment. In case the whole system of FIG. 12 is controlled by a computer separately provided, sequence signals can be provided by this computer or the like. However, in order for the system of FIG. 12 to be able to operate independently, it is required that a sequence circuit for generating sequence signals from a reset signal or the like be provided in the clock signal generator circuit 1202. Thus, reference numeral 1251 denotes a terminal for inputting a reset signal or the like for the purpose mentioned above, 1204 denotes buffer circuits for sending sequence signals to the signal destinations 1210, and 1232 denotes wires for sending sequence signals to the signal destinations 1210. For the reset signal input to the terminal 1251, it is possible to use a signal which is output when the supply voltage becomes stable after the power switch is closed (the so-called power-on reset signal) or a reset signal or the like which is sent by manual operation of a switch when some abnormality occurs in the system.

One phase adjusting circuit 1211 includes about one thousand to several thousand gates, the number of which varies with the accuracy or the range of phase adjustment, and therefore, if a logic LSI includes less than several thousand gates, a wiring circuit board having a plurality of LSIs mounted thereon is used as a signal destination 1210. However, if one logic LSI includes ten thousand gates or more, one LSI may be used as one signal destination 1210. In the case of an LSI of a much greater size, a plurality of signal destinations 1210 may be provided in one LSI. The wires 1231 may be metal film wiring laid on a wiring board, or may be cables or the like. The wires 1232 on the side of sending at least a reference signal (possibly on the side of sending a clock signal, too), should be designed so that the signal propagation times are equal (electrically equal in distance). The clock signal and the reference signal are high-speed signals, and require a high phase accuracy. So, circuits with a high drive capacity should preferably be used for the buffer circuits 1203. In contrast, since the sequence signals are far slower signals, not so high a drive capacity is required of the buffer circuits 1204, nor is so strictly equal a length required of the wires 1232.

A large number of flip-flop circuits 1221 are provided in the logic circuits 1220, and information is processed as signals are transmitted from one flip-flop circuit to another in synchronism with the clock signal. Therefore, if the phase of a clock signal supplied to the respective flip-flop circuits shifts from a specified phase more than a certain extent, there is a possibility of malfunctioning occurring in information processing. Special attention should be paid to the fact that the limit of an allowable phase shift is smaller for the flip-flop circuits required to operate faster. In this embodiment, in order to prevent this phase shift, a phase adjusting circuit 1211 is provided in each signal destination 1210 to adjust the clock signal supplied to a plurality of flip-flop circuits 1221 in a plurality of signal destinations 1210 so that all phases match predetermined phases. Description will next be made of the phase adjusting circuit 1211 and the clock signal generator circuit 1202.

Figure 13:
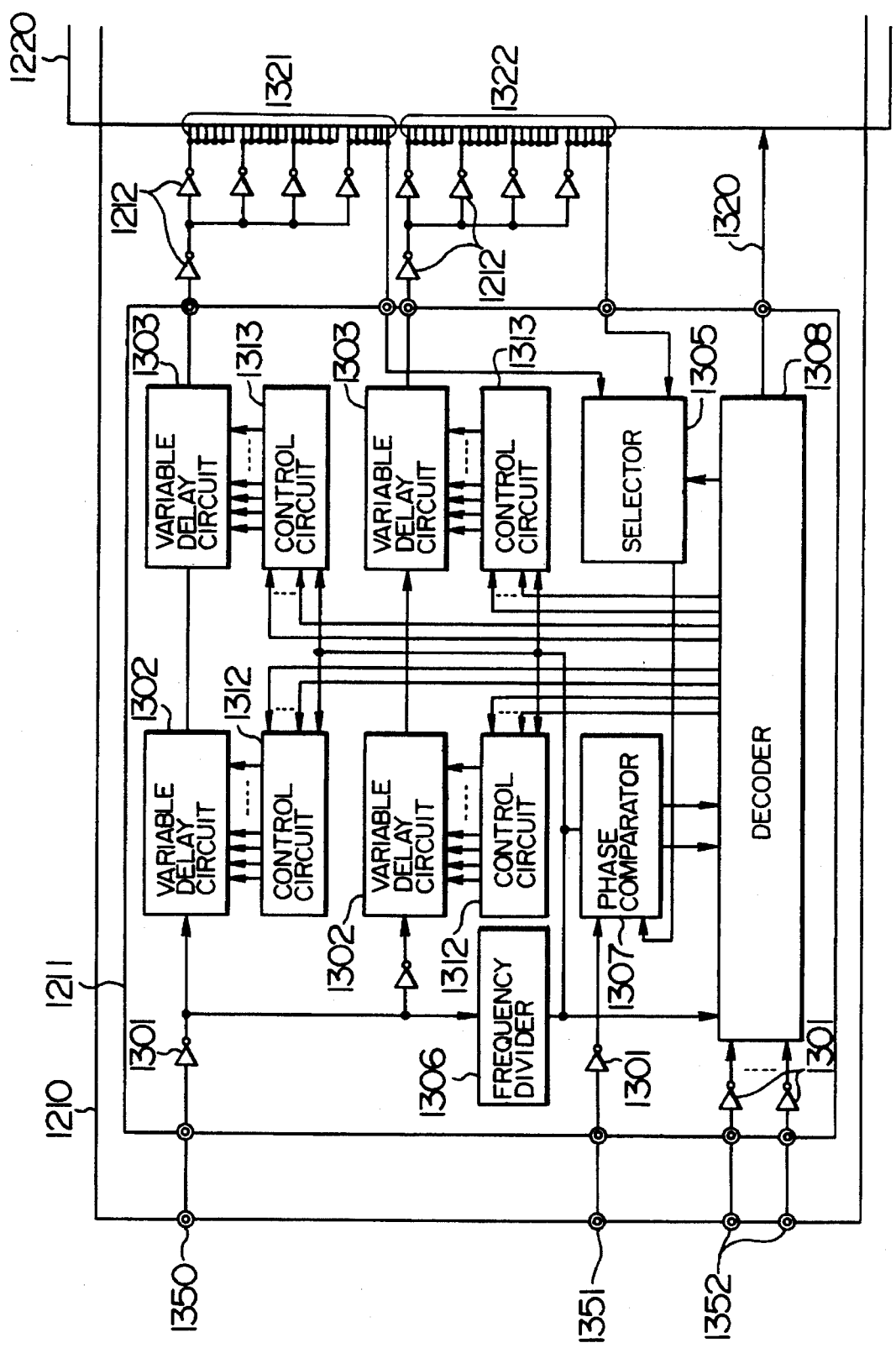
FIG. 13 is a circuit diagram showing an embodiment of a first part of the circuit of FIG. 12.

FIG. 13 shows an embodiment of the phase adjusting circuit 1211. In FIG. 13, reference numeral 1301 denotes input buffer circuits of an LSI on which this phase adjusting circuit is mounted, 1302 and 1303 denote variable delay circuits, 1312 and 1313 denote control circuits for controlling the variable delay circuits 1302 and 1303, 1305 denotes a selector circuit, 1306 denotes a frequency divider circuit, 1307 denotes a phase comparator circuit, and 1308 denotes a decoder circuit for supplying signals to the control circuits 1312, 1313 and the selector circuit 1305 or the like. Further, reference numeral 1321 denotes wiring for transmitting a clock signal of a first phase used in the logic circuits 1220, 1322 denotes wiring for transmitting a clock signal of a second phase used in the logic circuits 1220, 1350 denotes a terminal for inputting a clock signal, 1351 denotes a terminal for inputting a reference signal, and 1352 denotes a terminal for inputting the sequence signal.

The variable delay circuits 1302 are used to correct a phase shift of a clock signal caused by a temperature change or the like during operation of the logic circuits 1220, and variable delay circuits are used which do not produce a spike-like noise, such as shown in FIGS. 1 to 4. The variable delay circuits 1303 are used to correct a fixed phase shift resulting from variations in manufacture or the like of semiconductor devices, and variable delay circuits are used which have a great variable range, such as shown in FIGS. 5 and 7. Switching over of the delay time of the variable delay circuit 1303 is done from when a reset signal is received until the logic circuits 1220 start to operate. For the control circuits 1312 and 1313, such circuits as are shown in FIGS. 7 and 10 are selected depending on the kind of the variable delay circuits 1302 and 1303. The selector circuit 1305 selects a clock signal of a phase for phase comparison from among clock signals supplied to the logic circuits 1220, and to this end, a circuit as shown in FIG. 6 is used. The frequency divider circuit 1306 performs frequency division of a clock signal applied to the clock signal input terminal 1350 to generate a clock signal of a low frequency required for the control circuits 1312, 1313 and the phase comparator circuit 1307. The frequency division ratio of the frequency divider circuit 1306 may be about ⅛, for example.

The phase comparator circuit 1307 compares the phase of a clock signal fed to the logic circuits 1220 with the phase of a reference signal applied to the reference signal input terminal 1351. The decoder circuit 1308, according to a sequence signal (information such as notifying the kind of a reference signal being currently sent decides a clock signal of which phase to transmit from the selector circuit 1305 to the phase comparator circuit 1307 according to a sequence signal, and whether it is the right time to operate the logic circuits 1220). The decoder circuit 1308 also decides to which control circuit 1312 or 1313 should be transmitted the output of the phase comparator circuit 1307, and supplies a signal 1320 to notify whether or not to operate the logic circuits 1220. Details of the phase comparator circuit 1307 and the decoder circuit 1308 will be described later referring to FIGS. 14 and 15.

Figure 14:
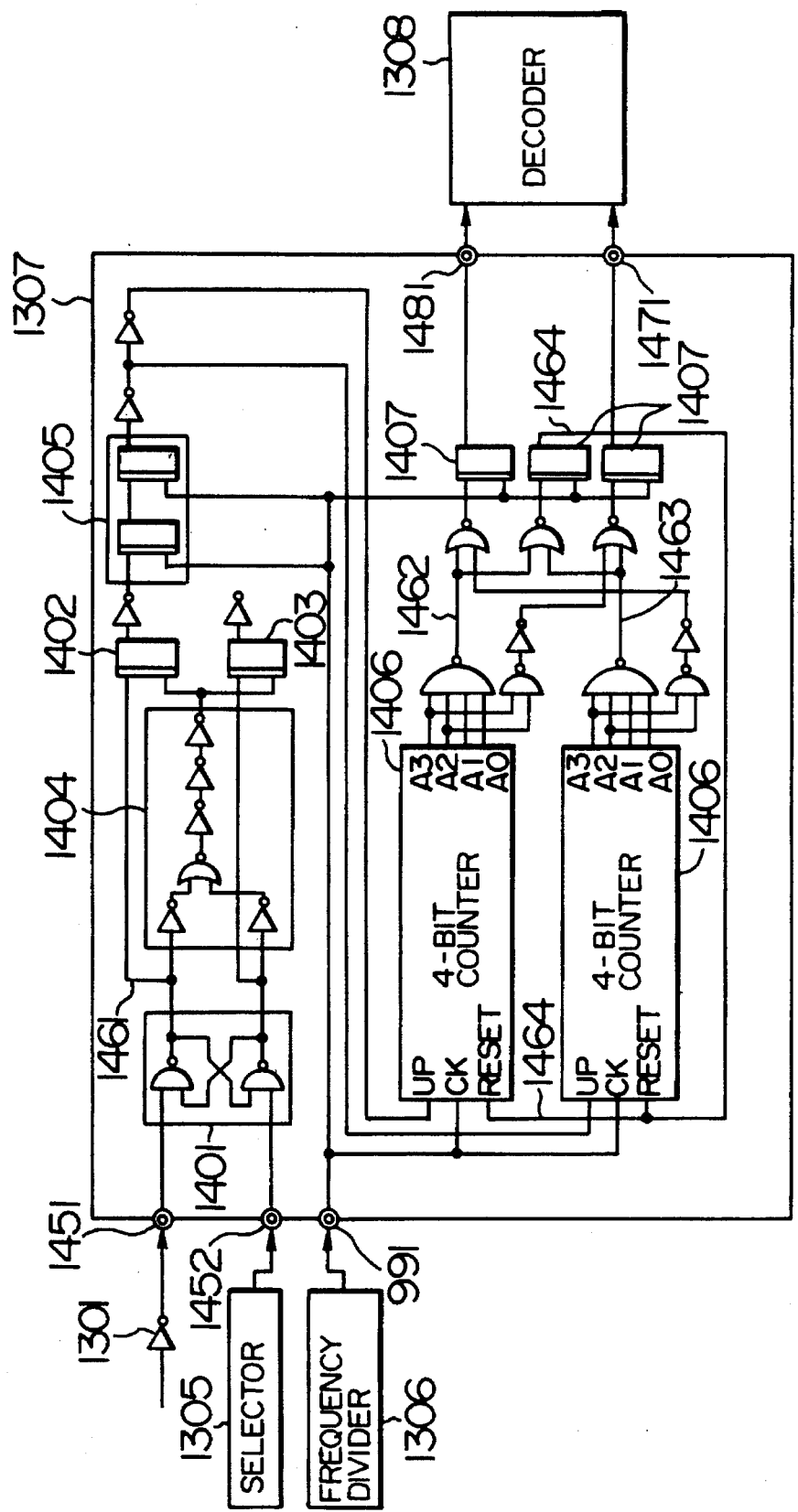
FIG. 14 is a circuit diagram showing an embodiment of the first part of the circuit in FIG. 13.

FIG. 14 shows an example of the phase comparator circuit 1307. In FIG. 14, reference 1452 denotes a terminal for inputting a reference signal, 1452 denotes a terminal for inputting a clock signal selected by the selector circuit 1305, and 991 denotes a terminal for inputting a clock signal generated by the frequency divider 1306. Reference numerals 1471 and 1481 denote terminals for outputting decision results. If the clock signal input to the terminal 1452 is faster than the reference signal input to the terminal 1451 (increasing the delay time of the variable delay circuit), the clock signal is output to the terminal 1471, and if the clock signal input to the terminal 1452 is slower (decreasing the delay time of the variable delay circuit), the clock signal is output to the terminal 1481.

Reference numeral 1401 denotes two 2-input NAND circuits with inputs and outputs mutually intersecting between the two NAND circuits, and the two 2-input NAND circuits decide a phase timing of a reference signal and a clock signal for every period. Reference numeral 1402 denotes a flip-flop circuit which holds a decision result of the 2-input NAND circuits 1401 for one period, 1403 denotes a flip-flop circuit for equalizing the load applied to the 2-input NAND circuits 1401, 1404 denotes a circuit for generating a timing signal to cause the flip-flop 1402 to operate steadily by slightly delaying the output of the 2-input NAND circuits 1401 by a gate delay, and 1405 denotes flip-flop circuits which receive the output from the flip-flop circuit 1402 in step with the periods of the low-frequency clock signal input from the terminal 991 and hold the output of the flip-flop circuit at the preceding stage as an intermediate value to thereby prevent malfunctioning.

Reference numeral 1406 denotes 4-bit counter circuits which respectively perform counting in step with the periods of the low-frequency clock signal input from the terminal 991, and only one of the counters 1406 proceeds with counting according to the output of the flip-flop circuits 1405. This circuit is provided to prevent a signal representing a wrong decision from being transmitted to the circuits at the subsequent stages — a wrong decision which the 2-input NAND circuits make abruptly affected by noise or the like. Reference numeral 1407 denotes a flip-flop circuit to hold the decision result which has passed the counter circuit 1406 for one period of a low-frequency clock signal.

The counter circuits 1406 can be realized by using a circuit shown in FIG. 11A. Note that the counter circuits 1406 are constructed so that when node 1464 goes to the high level, all the flip-flop circuits in the counter circuit 1406 are reset to the 1 state. Suppose that as one of the counter circuits 1406 has reached a count of 15 and all the outputs go to the 0 state, either the internal node 1462 or 1463 is pulled to the low level. At this time, if the other counter circuit 1406 has a count of 11 or less, a signal to increase or decrease the delay time of the variable delay circuit is output to the output terminal 1471 or 1481, but if the other counter circuit 1406 has reached a count of 12 or more, the output terminals 1471 and 1481 remain at the low level. In either case, when the count of one counter has reached 15, the node 1464 goes to the high level, and both counter circuits 1406 are reset and start to count from 0 again.

More specifically, if the occurrence rate of decision results of the 2-input NAND circuits 1401 is higher on one side at the rate of more than 15 to 11, a signal to increase or decrease the delay time of the variable delay circuit is output. If this rate is less than 15 to 12, the occurrence rate is regarded as substantially the same, and no signal to change the delay time is output. The detailed principle of the phase comparator circuit in FIG. 14 is disclosed in JP-A-2-168308 mentioned earlier.

Figure 15:
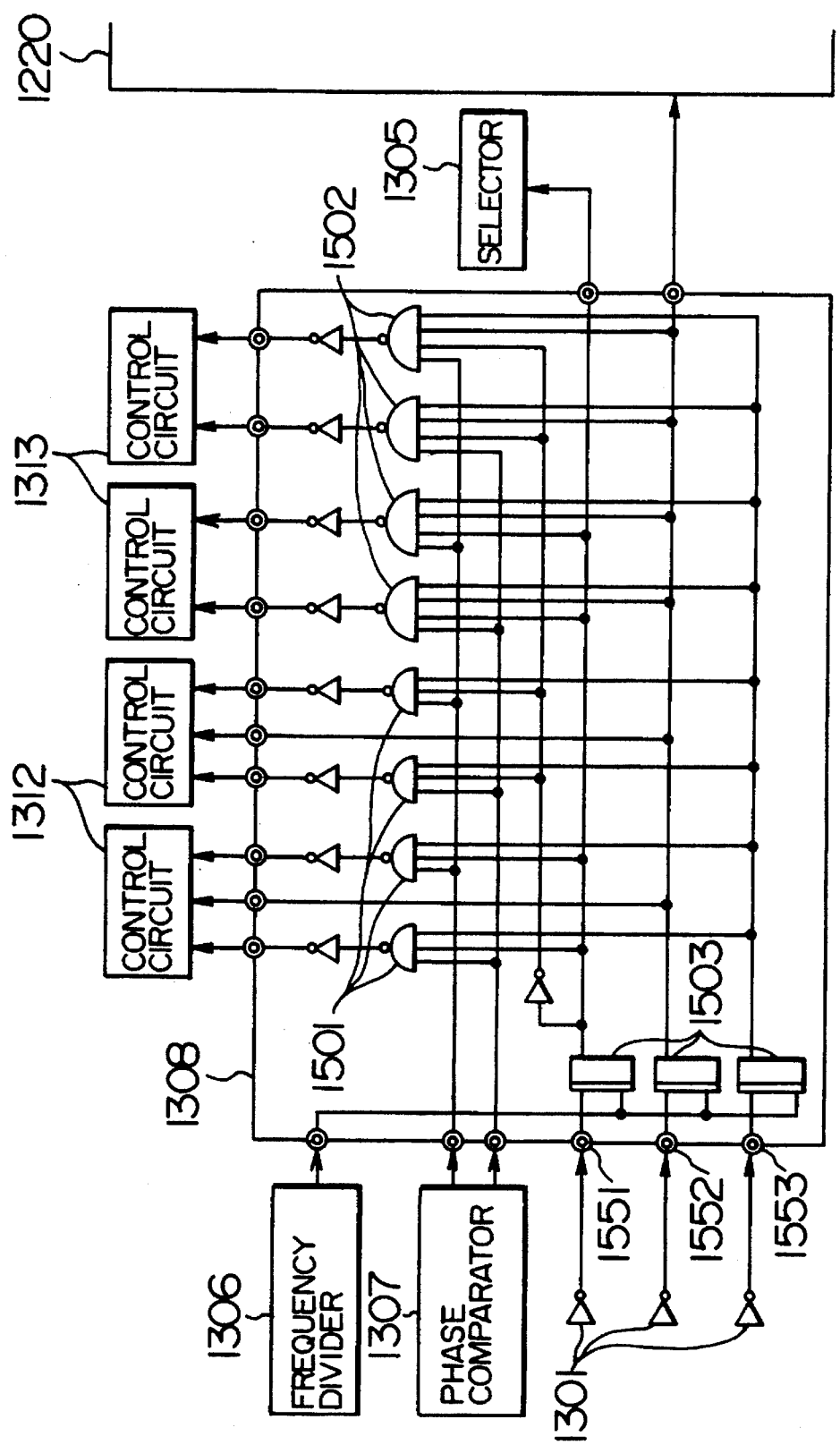
FIG. 15 is a circuit diagram showing an embodiment of a second part of the circuit of FIG. 13.

FIG. 15 shows an embodiment of the decoder circuit 1308 in FIG. 13. In FIG. 15, reference numeral 1301 denotes input buffer circuits connected to the sequence signal input terminals 1352. Reference numeral 1501 denotes 3-input NAND circuits, 1502 denotes 4-input NAND circuits, and 1503 denotes flip-flop circuits for receiving sequence signals in synchronism with a low-frequency clock signal. Reference numeral 1551 denotes a terminal for inputting a sequence signal to inform whether the reference signal being sent at this moment indicates the phase of a clock signal of the first phase or the phase of a clock signal of the second phase, 1552 denotes a terminal for inputting a sequence signal to inform whether this is the stage of initial adjustment or the operating condition, and 1553 denotes a terminal for inputting a sequence signal to inform whether this is the time of some other sequence signal or reference signal changing from one state to another.

As shown in FIG. 15, this decoder circuit controls the selector circuit 1305 according to a sequence signal input to the terminal 1551, and also controls to which phase of the control circuit 1312 or 1313 to send a signal from the phase comparator circuit. In addition, based on the sequence signal input to the terminal 1552, a signal indicating whether or not this is the time of initial adjustment is sent to the logic circuits 1220 and the control circuits 1312, 1313. In each of the control circuits 1312, when this signal goes to the high level, some predetermined flip-flop circuits are reset to the 0 state, and other flip-flop circuits are set to the 1 state. By this, the amount of delay of the variable delay circuit 1302 is set to the center (or a predetermined suitable value) of the variable range, so that a sufficient adjustable range during operation can be secured. This condition continues until the initial adjustment is finished.

After the initial adjustment is finished, the control circuits 1312 start to perform a normal control operation, and simultaneously, a signal to vary the delay time ceases to go to the control circuits 1313, and the control signal that existed at the end of the initial adjustment is held. Also, a signal is sent to the logic circuits to inform that the control operation has started. Note that when those sequence signals and the reference signal change their states, the sequence signal applied to the terminal 1553 goes to the low level to prevent a signal from increasing or decreasing the delay time from going to any of the control circuits 1312, 1313 to thereby preclude malfunctioning.

Figure 16:
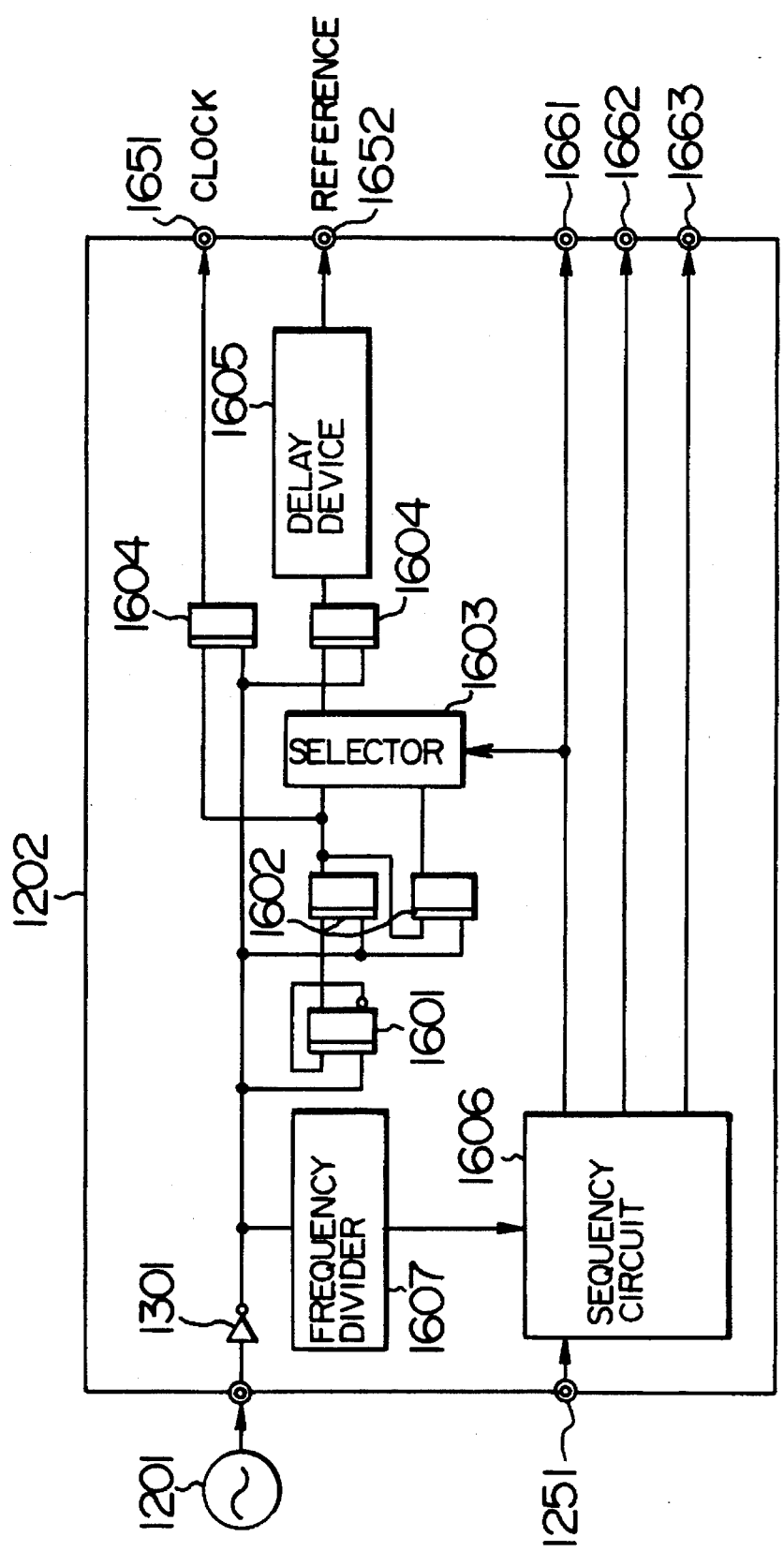
FIG. 16 is a circuit diagram showing an embodiment of the second part of the circuit of FIG. 12.

FIG. 16 shows an embodiment of the clock signal generator circuit 1202 in FIG. 12. In FIG. 16, reference numeral 1601 denotes a flip-flop circuit for generating a frequency of a clock signal by frequency division of the output of the high frequency oscillator 1201, 1602 denotes flip-flop circuits for producing two signals which are out of phase by the same degree as the phase shift of the clock signals of the first and the second phases, 1603 denotes a selector circuit for selecting either one of the outputs of the flip-flop circuits 1602 according to a sequence signal and producing a reference signal, 1604 denotes flip-flops for putting a clock signal and a reference signal in a specified phase relationship by synchronizing them with the output of the high frequency oscillator, 1605 denotes a delay device for evenly delaying the reference signals with respect to the respective signal destinations 1210 before being sent to the signal destinations 1210 so as to strike a balance of delay time with the clock signal delayed by the buffer circuits 1212 and by the variable delay circuits 1302, 1303 in the phase adjusting circuits 1211 located in the signal destinations 1210, 1606 denotes a sequence circuit for producing a sequence signal, and 1607 denotes a frequency divider circuit for producing a low frequency clock signal for actuating the sequence circuit.

Further, reference numeral 1651 denotes a terminal for outputting a clock signal, 1652 denotes a terminal for outputting a reference signal, 1661 to 1663 denote terminals for outputting sequence signals to respectively supply to the terminals 1551 to 1553 in FIG. 15, and 1251 denotes a terminal for inputting a reset signal. Note that the frequency divider circuit 1607 which divides by a larger number, about 1024, for example, than the frequency divider circuit 1306 of FIG. 13 should be used. Instead of delaying the reference signal by the delay device 1605, if the leading edge of a clock signal more than one period before is matched with the reference signal, the delay device 1605 need not necessarily be provided.

Figure 17:
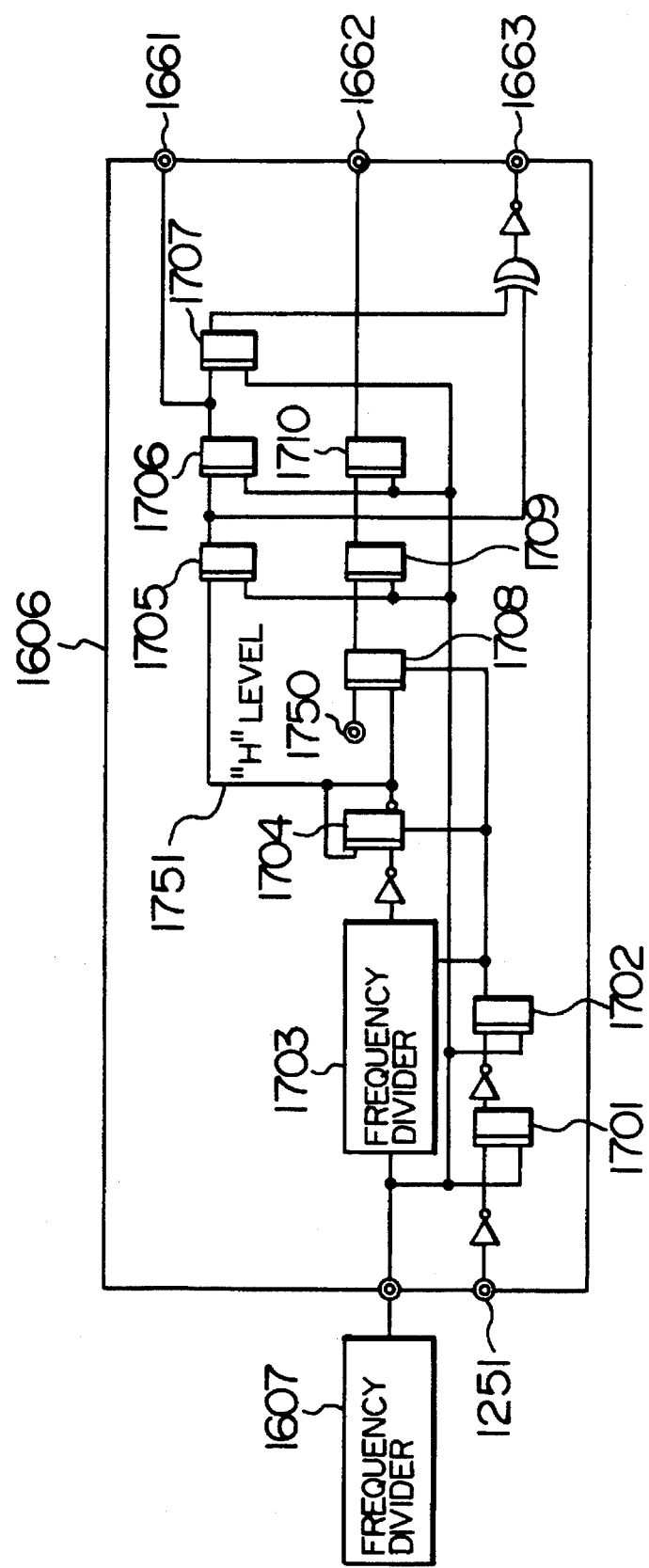
FIG. 17 is a circuit diagram showing an embodiment of another part of the circuit of FIG. 16.

FIG. 17 shows an embodiment of the sequence circuit 1606. In FIG. 17, reference numeral 1701 denotes a flip-flop circuit for receiving a reset signal input to the terminal 1251 in synchronism with a low frequency clock signal supplied from the frequency divider circuit 1607, 1702 denotes a flip-flop circuit for again synchronizing with the same clock signal in order to prevent malfunctioning when the output of the flip-flop circuit 1701 is held at an intermediate value between the high and low levels (when a so-called hazard occurs), 1703 denotes a frequency divider circuit for further dividing the low frequency clock signal to produce sequence signals for changing over reference signals with a fixed period in cycles, and 1704 denotes a flip-flop circuit for dividing the frequency of the above-mentioned signal by two to produce a sequence signal to decide a reference signal of which phase to send. Reference numerals 1705 to 1707 denote flip-flop circuits that constitute a shift register circuit which operates in synchronism with a low frequency clock signal supplied by the frequency divider circuit 1607, and this shift register circuit produces signals (output to the terminal 1661) for switching over the reference signals and a signal to indicate whether or not switching over the reference signal is in progress. Reference numeral 1708 denotes a flip-flop circuit for detecting that the signals for switching over the reference signals have completed a round of their jobs after the reset signal applied to the terminal 1251 was removed, and 1709 and 1710 denote flip-flop circuits for causing the signals to change in synchronism with the signal output to the terminal 1661. A high level signal is always applied to the terminal 1750 leading to the flip-flop circuit 1708.

It ought to be noted that the frequency division ratio of the frequency divider circuit 1703 is set such that the period of output of this frequency divider circuit is longer than a time required for adjusting the delay time of the variable delay circuit 1303 in FIG. 13. For example, if the switch-over range of the delay time of the variable delay circuit 1303 is 1280 steps, the frequency division of the frequency divider circuit 1306 may be by 8 or so, the counter circuit 1406 in FIG. 14 is a 4-bit counter (so-called divide-by-16), and the frequency division factor of the flip-flop circuit 1601 in FIG. 16 is 2. If the frequency divider circuit 1607 is a divide-by-1024 type, the divisor of the frequency divider circuit 1703 has only to be 320 (320 = 1280 × 8 × 16 × 2 − 1024) or a greater number. A frequency divider circuit can be formed easily if the n-th power of 2 is used as the divisor in the frequency division, and in this case, the divisor needs to be 512 or a larger number. In practical applications, if a much greater number is used as the divisor in the frequency division to gain time until the temperature of the whole device becomes stable to some extent, the required variable range of the variable delay circuit 1302 in FIG. 13 can be smaller.

In FIG. 17, while the reset signal input to the terminal 1251 is at the high level, the output of the flip-flop circuit 1702 is at the high level, and the frequency divider circuit 1703 and the flip-flop circuits 1704, 1708 are all reset. When the reset signal to the terminal 1251 goes to the low level, the output of the flip-flop circuit 1702 is pulled to the low level, so that the reset state of the frequency divider circuit 1703 and the flip-flop circuits 1704, 1708 is released. In response, the frequency divider circuit 1703 starts to operate, and the flip-flop circuit 1708 waits for a leading edge of a signal to appear on the node 1751.

Just after the reset signal is released, the node is already at the high level; in other words, when the signal which appears on the node 1751 goes to the low level once and goes up to the high level (in other words, after sequencey signals to switch over the reference signals have completed a round of their jobs), the output of the flip-flop circuit 1708 changes. Thereafter, so long as the reset signal applied to the terminal 1251 does not go to the high level, the output of the flip-flop circuit 1708 is held at the high level. Signals which appear on the node 1751 are shifted one stage at a time by the shift register circuit constituted by the flip-flop circuits 1705 to 1707, so that from an exclusive OR of outputs of the flip-flop circuits 1705 and 1707, it is possible to detect whether or not the output of the flip-flop circuit 1706 existing between the circuits 1705 and 1707 changes. In the manner as described, the clock phase adjusting device 1200 can supply clock signals of various phases and sequence signals adjusted to desired phases to a plurality of signal destinations 1210.

Figure 18:
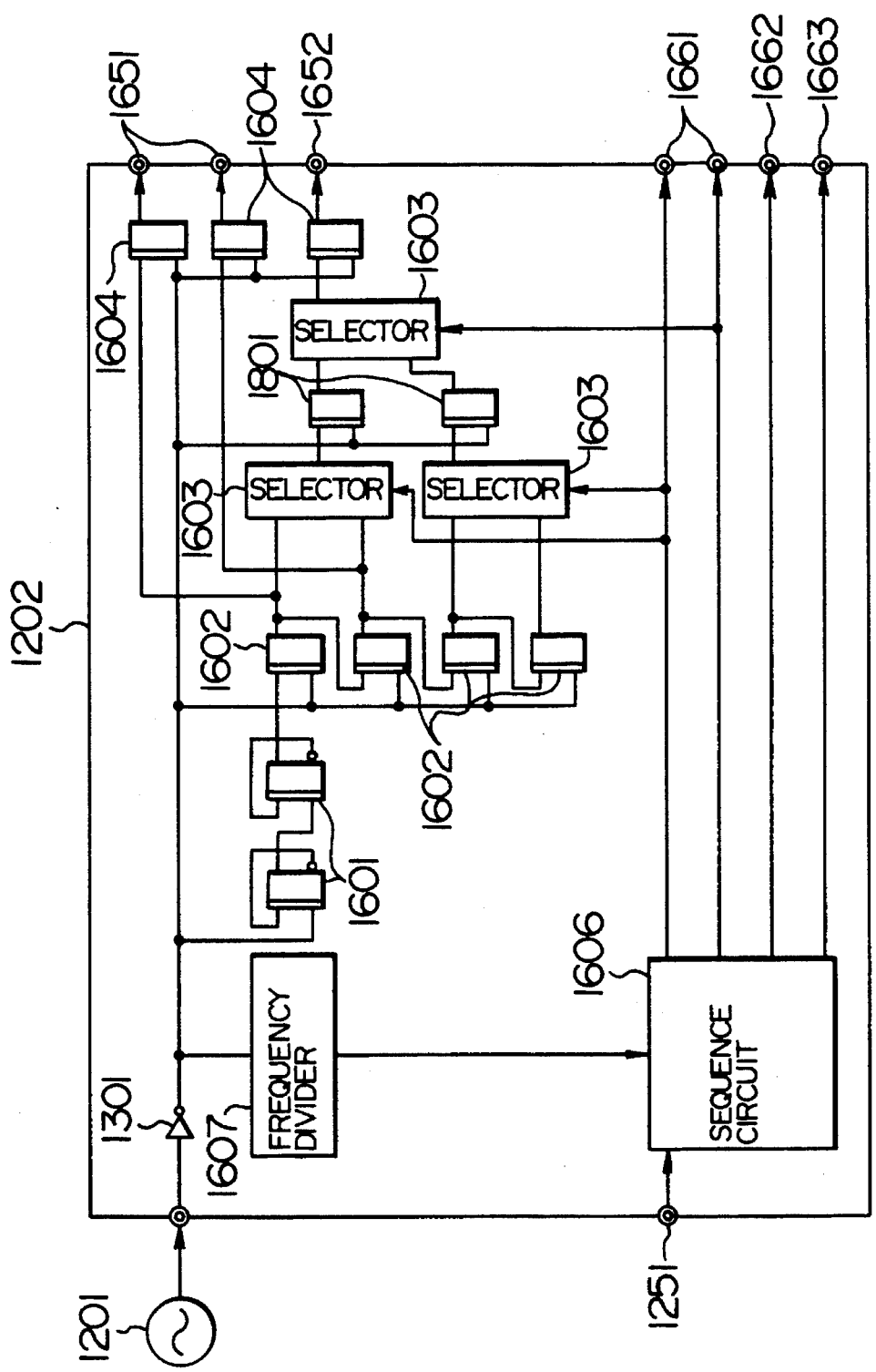
FIG. 18 is a circuit diagram showing another embodiment of the second part of the circuit of FIG. 12.

FIG. 18 shows another embodiment of the clock signal generator circuit 1202 for supplying the logic circuits 1220 with clock signals of four phases. The circuit shown in FIG. 18 differs from the circuit in FIG. 16 in that a divide-by-4 frequency divider circuit is constituted by flip-flop circuits 1601 which produce a frequency of a clock signal by frequency division of the output of the high frequency oscillator 1201, the flip-flop circuits 1602 which produce a signal having the same phase difference as the phase difference of the clock signal are arranged to output signals of four phases, two bits are required for sequence signals (output to the terminals 1661) to select a phase of the reference signal, and the selector circuits 1603 for outputting reference signals of different phases are arranged to select one out of four signals. In FIG. 18, the parts having the same function as those in FIG. 16 are designated by the same reference numerals as in FIG. 16.

The selector circuit 1603 is a 4-to-1 selector circuit, and can be so formed as to select one out of four signals all at once. In a case where a high-speed clock signal is required, such as is unable to come from the flip-flop circuit 1602 and reach the flip-flop circuit 1604 because of too long a delay time of the 4-to-1 selector circuit, this circuit may be formed so that the clock signal passes two stages of 2-to-1 selector circuits as shown in FIG. 18. Furthermore, flip-flop circuits 1801 are inserted between the selector circuits, and by this arrangement, the delay time can be reduced to that of the 2-to-1 selector circuit.

Figure 19:
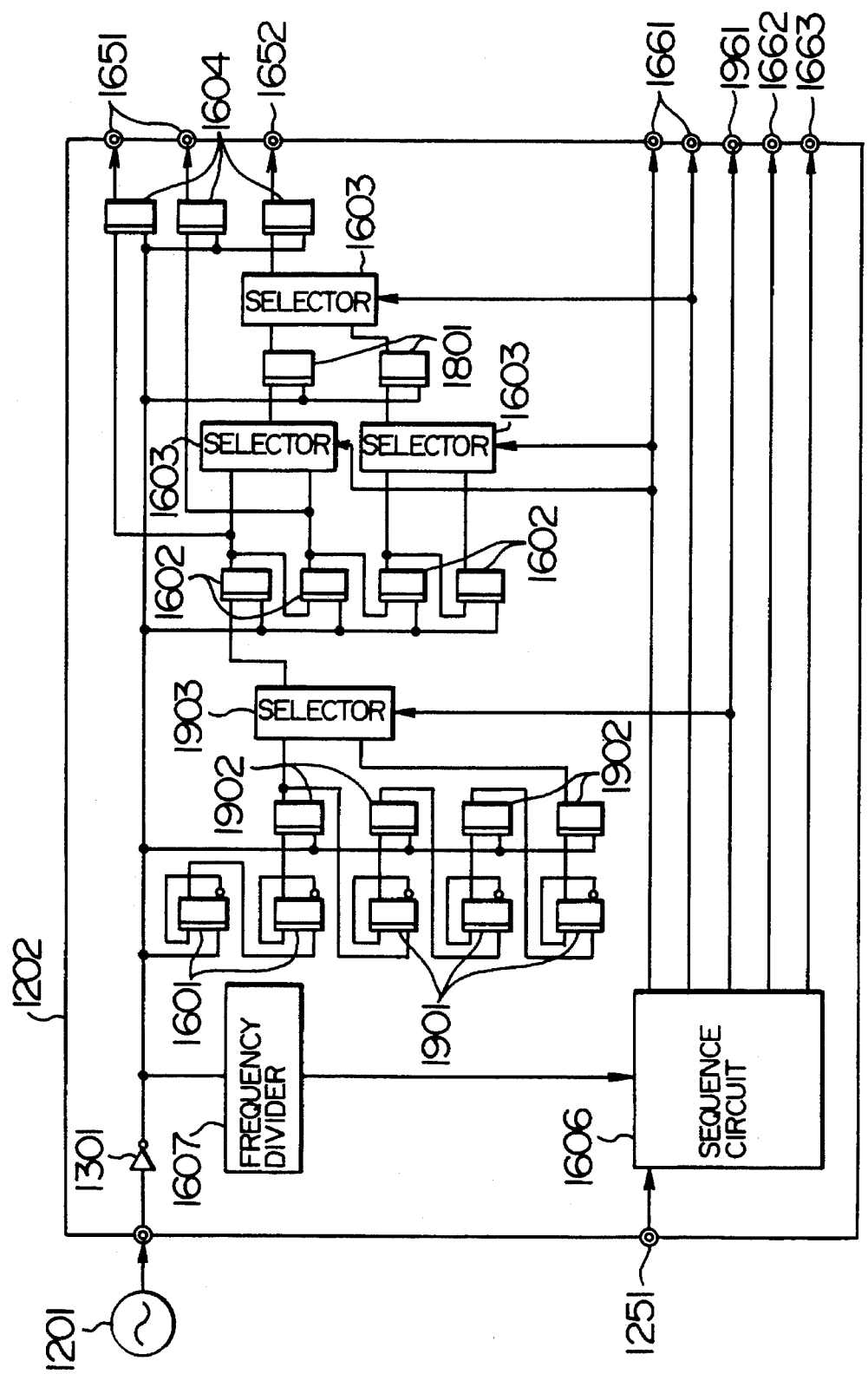
FIG. 19 is a circuit diagram showing a further embodiment of the second part of the circuit of FIG. 12.

FIG. 19 shows a further embodiment of the clock signal generator circuit 1202, and this clock signal generator circuit is used to finely adjust the delay time at a frequency to be practically used after the initial rough adjustment of the delay time of the variable delay circuit 1303 in FIG. 13 at a low frequency clock signal. In FIG. 19, reference numeral 1901 denotes flip-flop circuits constituting a frequency divider circuit for producing a low frequency clock signal for rough adjustment, 1902 denotes flip-flop circuits which cause the output signals of the flip-flop circuits 1901 and 1601 to be synchronized with the output of the high frequency oscillator 1201, and 1903 denotes a selector circuit for switching over between a low frequency clock signal for rough adjustment and a clock signal practically used. Reference numeral 1961 denotes a terminal for outputting a sequence signal to notify whether this is a rough adjustment time period or a fine adjustment time period. Note that phase adjustment is possible at each signal destination 1210 even if it is not clear whether this is a rough adjustment time period or a fine adjustment time period, and that by making an arrangement that, in rough adjustment control signals for a small variable range of delay time of the variable delay circuit (control signals applied to the terminals 962 to 966 in FIG. 7, for example) are fixed at a certain value, the time required for rough adjustment can be reduced.

Figure 20:
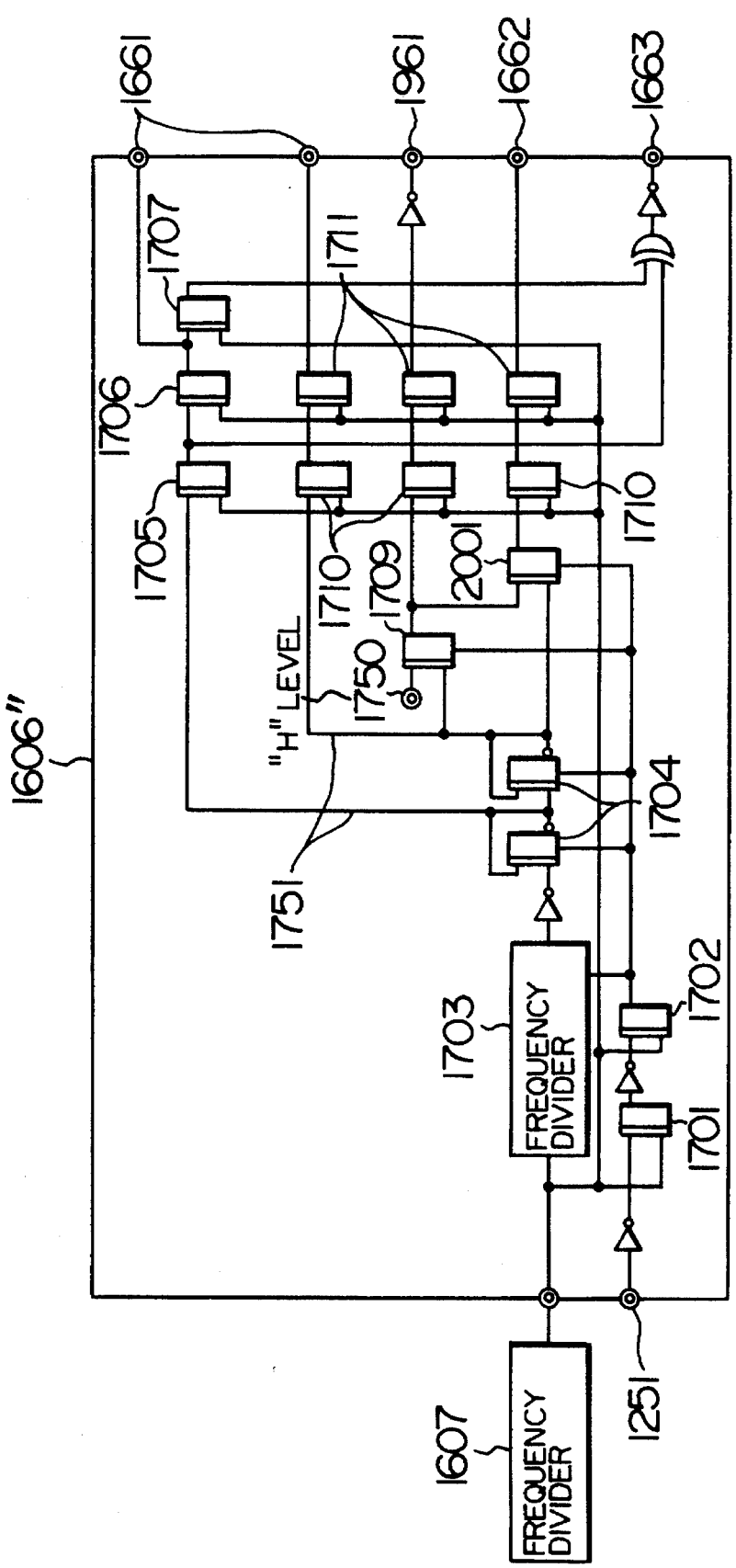
FIG. 20 is a circuit diagram showing an embodiment of a part of the circuit of FIG. 19.

FIG. 20 shows an embodiment of the sequence circuit 1606 used in the clock signal generator circuit shown in FIG. 19. The circuit in FIG. 20 differs from the circuit in FIG. 17 in that in order to output two bits of sequence signals at a time, there are provided two flip-flop circuits 1704 which produce sequence signals (sequence signals output to the terminals 1661) to select a phase of a reference signal to send, and in that, in addition to a flip-flop circuit 1709 which detects that the sequence signals output to the terminals 1661 have completed a first round of their jobs, another flip-flop circuit 2001 is provided which detects that the sequence signals have completed a second round of their jobs. In the first round, rough adjustment is performed, while in the second round, fine adjustment is performed. When the second round is finished, the variable delay circuit under control is switched over from 1303 to 1302 and at the same time, the logic circuits 1220 are put into operation. By making some additional arrangements that can detect that the sequence signals have completed a third round of their jobs, it is made possible that on completion of the second round, only the variable delay circuits to be controlled are changed over and after the third round is finished, the logic circuits 1220 are put into operation.

Figure 21:
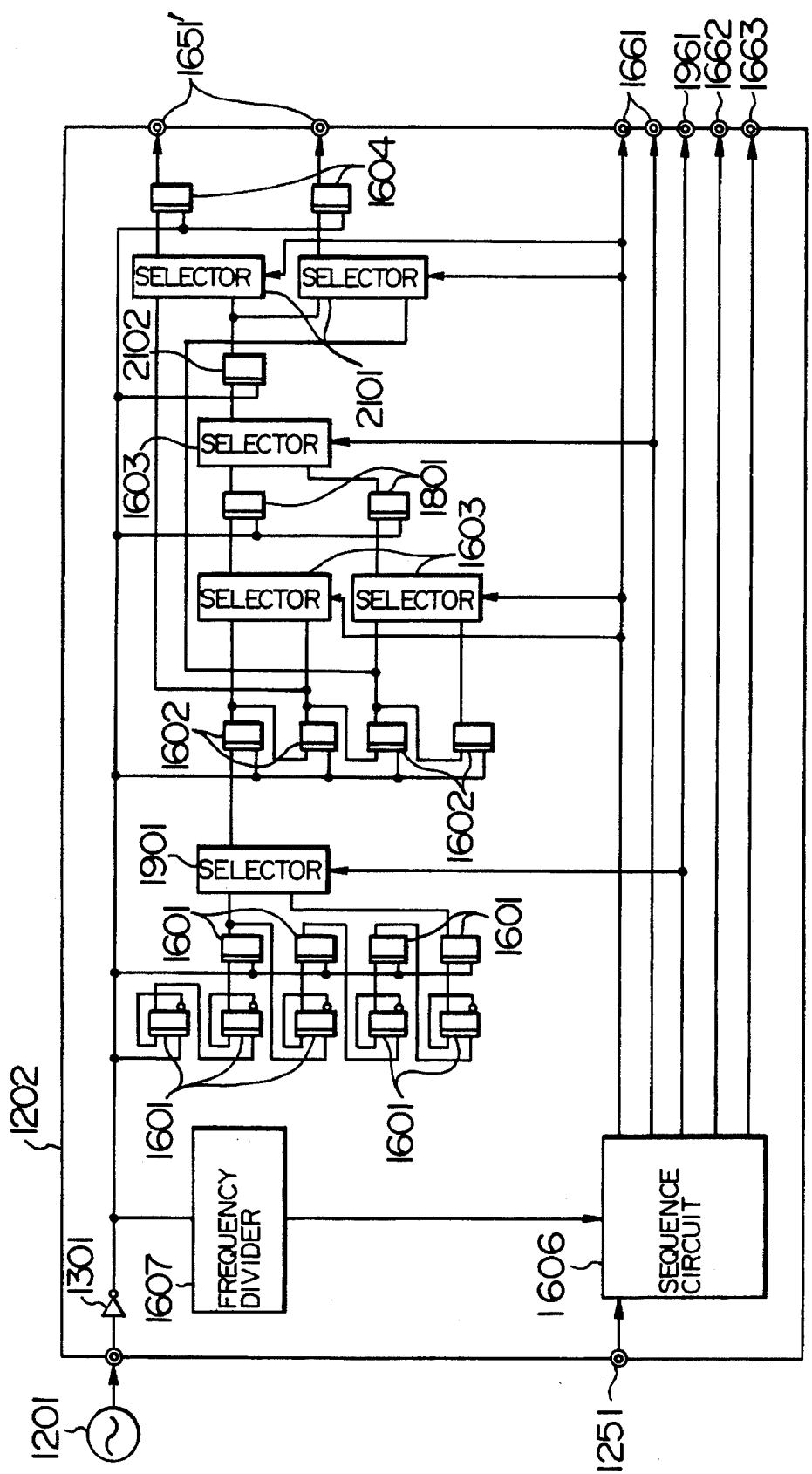
FIG. 21 is a circuit diagram showing yet another embodiment of the second part of the circuit in FIG. 12.

FIG. 21 shows yet another embodiment of the clock signal generator circuit 1202, in which the clock signals and reference signals are output over common terminals, thereby saving the number of winings connecting the clock signal supply source and the signal destinations 1210 and the terminals (signal pins of LSI) as well.

In FIG. 21, reference numeral 2101 denotes selector circuits, and 2102 denotes a flip-flop circuit. The circuit of FIG. 21 differs from the circuit in FIG. 19 in that the selector circuits 2101 are provided to make it possible to output both a clock signal and a reference signal at the terminals 1651. For example, when a reference signal is sent which has a phase corresponding to the phase of the first- or third-phase clock signal, a clock signal is sent from a terminal 1651' on the upper side, and a reference signal is sent from the terminal 1651' on the lower side on FIG. 21. Or, when a reference signal is sent which has a phase corresponding to the phase of the second- or third-phase clock signal, conversely, a clock signal is sent from the terminal 1651' on the upper side, and a reference signal is sent from the terminal 1651' on the lower side on FIG. 21. By this arrangement, one set of wiring or the like for sending a reference signal can be saved.

Figure 26:
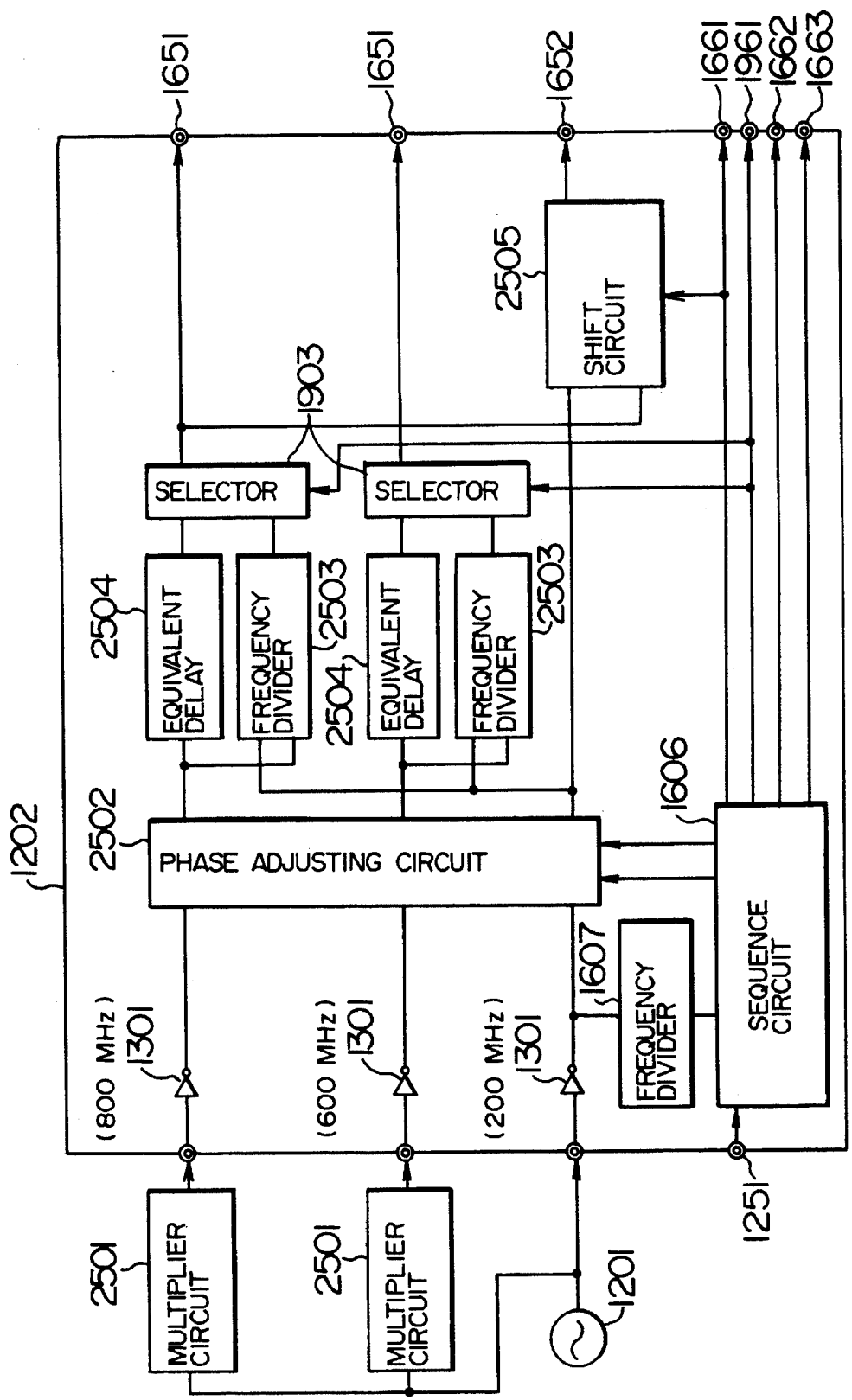
FIG. 26 is a circuit diagram showing a still further embodiment of the second part of the circuit of FIG. 12.

Note that the flip-flop circuit 2102 is required when a signal cannot come from the flip-flop circuit 1801 to the flip-flop circuit 1604 passing through the selector circuits 1603 and 2101 within one period of output of the high frequency oscillator 1201. When FIG. 26 is later explained, description will be made of the method of generating a clock signal to supply to the logic circuits 1220 from the clock signal and the reference signal sent as described.

Figure 22:
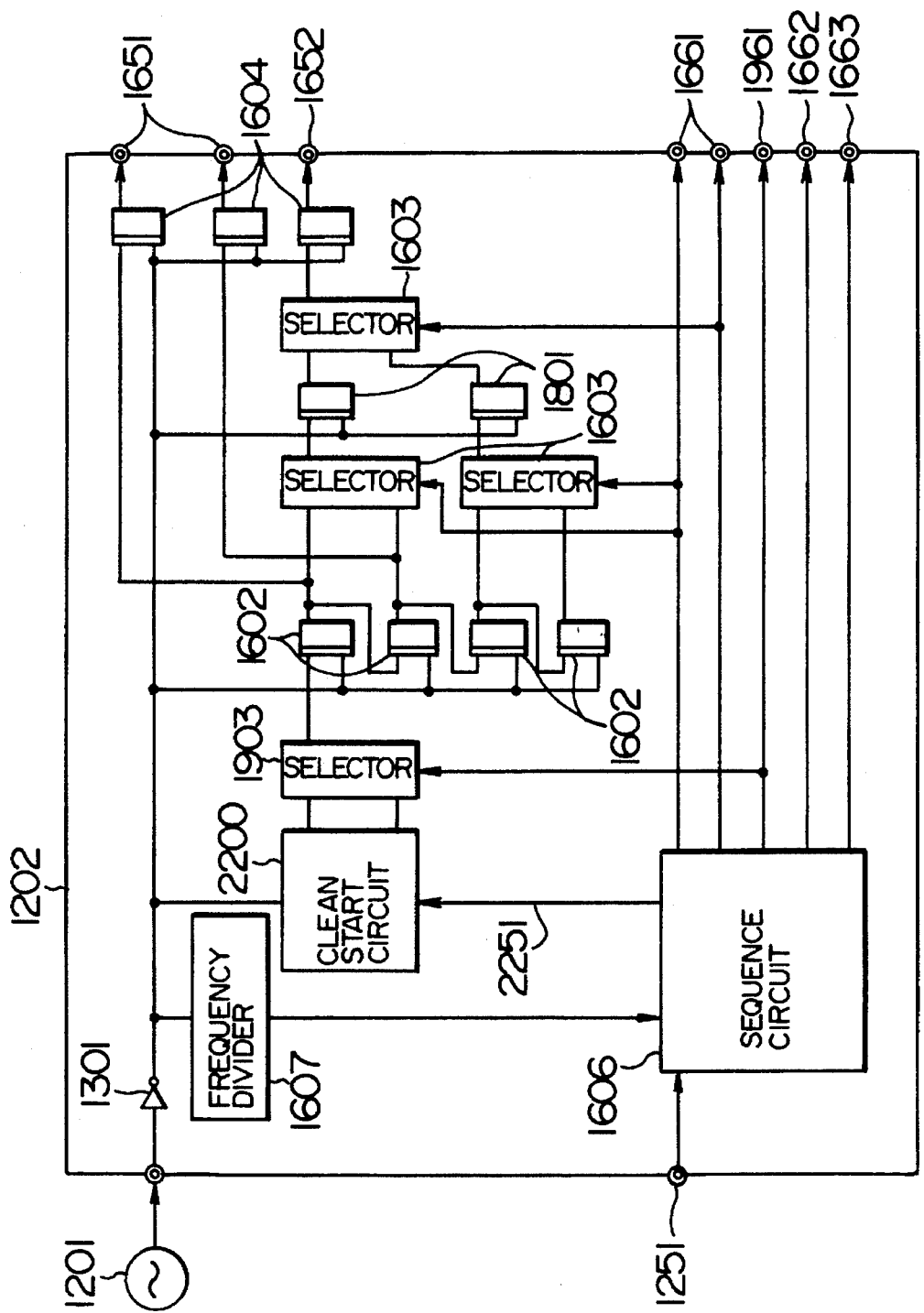
FIG. 22 is a circuit diagram showing a still further embodiment of the second part of the circuit of FIG. 12.

FIG. 22 shows a still further embodiment of the clock signal generator circuit 1202, which functions to temporarily stop the clock signal for a period of time from when the phase adjustment of the clock signal is finished until the logic circuits 1220 are put into operation. By using this circuit, even if there is a skew in the path through which a sequence signal is transmitted, the flip-flop circuits in the logic circuits 1220 can be started all at once.

In FIG. 22, reference numeral 2251 denotes a sequence signal which stays at the high level for a period of time from the end of phase adjustment till the logic circuits are put into operation, and 2200 denotes a clean start circuit. The clean start circuit 2200 is arranged to output a signal formed by frequency-division of the output of the high frequency oscillator 1201 while the sequence signal is at the low level as in the flip-flop circuits 1601, 1901, 1902 in FIGS. 19 and 20, but has its output pulled to the low level when the sequence signal 2251 goes to the high level. As for the sequence signal 2251, one stage of flip-flop circuit may be added after the flip-flop circuits 1710, 1711 subsequent to the flop-flop circuit 2001 in FIG. 20, so that the sequence signal 2251 goes to the high level only when there is disagreement between the output of the flip-flop circuit 1710 at the first stage and the output of the added flip-flop circuit at the third stage.

FIG. 23 shows an embodiment of the clean start circuit 2200. In FIG. 23, reference numeral 2201 denotes flip-flop circuits for receiving a sequence signal output from the terminal 2251 in synchronism with the output of the high frequency oscillator 1201 and for, and preventing a hazard from occurring, and 2202 denotes a NOR circuit for producing a clock signal which stops only when the output of the flip-flop circuits 2201 is at the high level. This circuit successively performs frequency division of the clock signal, output from NOR 2202, by flop-flop circuits 1601, 1901 while the output of the flip-flop circuits is at the low level, and sends the output synchronized with the output of the high frequency oscillator 1201 by flip-flop circuits 1902 to a selector circuit 1903. However, when the output of the flip-flop circuits 2201 goes to the high level, the output of the NOR circuit 2202 is fixed at the low level, and at the same time, the flip-flop circuits 1601 are reset, causing their outputs to be fixed at the low level. When the output of the flip-flop circuits again goes to the low level, the flip-flop circuits 1601 start the frequency division operation again. In those operations, the moment the output of the flip-flop circuits 2201 changes, the other input of the NOR circuit 2202 has just gone to the high level, so that a spike-like noise is never output by the NOR circuit 2202 when the sequence signal 2251 changes.

Figure 24:
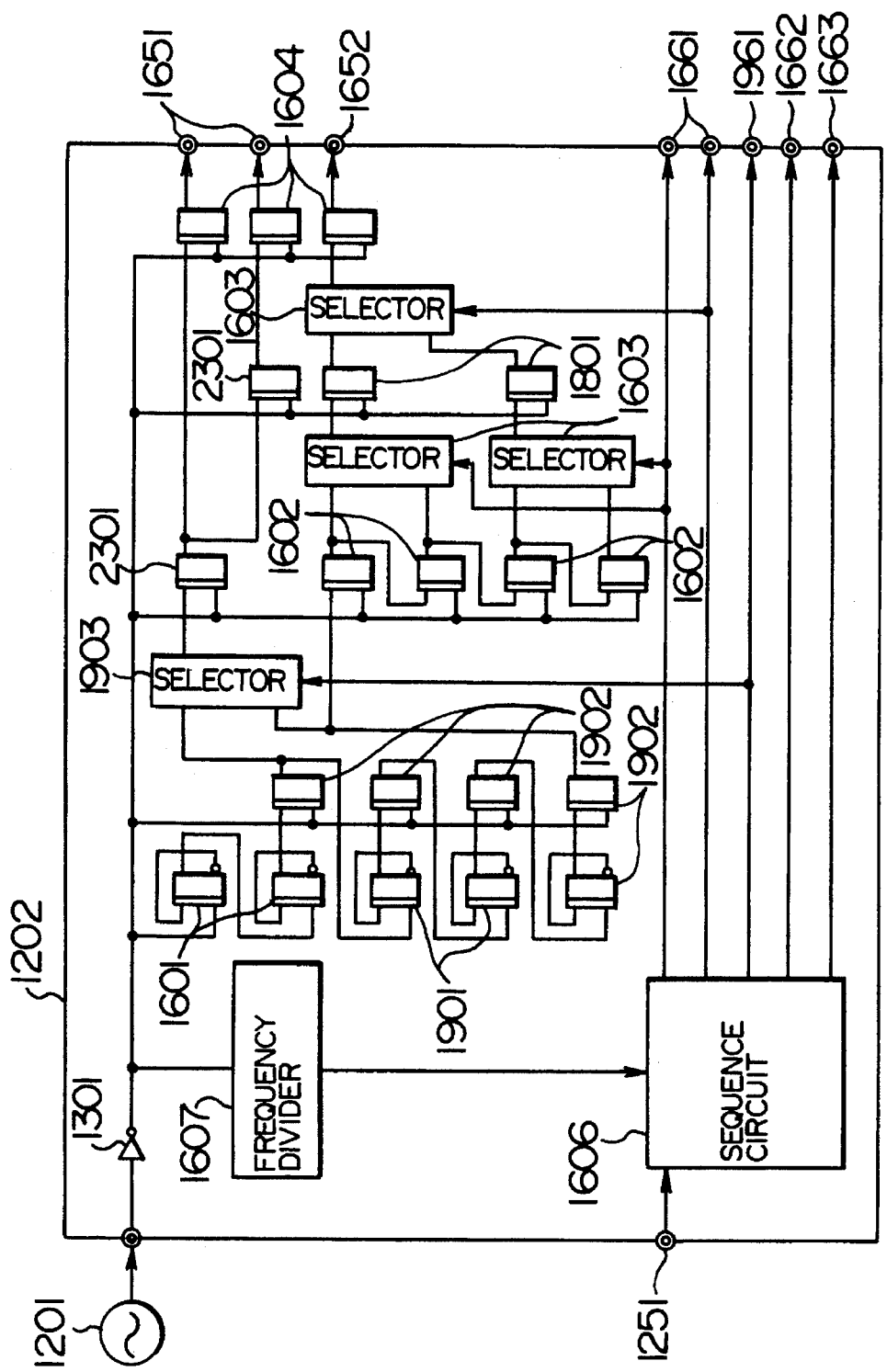
FIG. 24 is a circuit diagram showing an additional embodiment of the second part of the circuit of FIG. 12.
Figure 27:
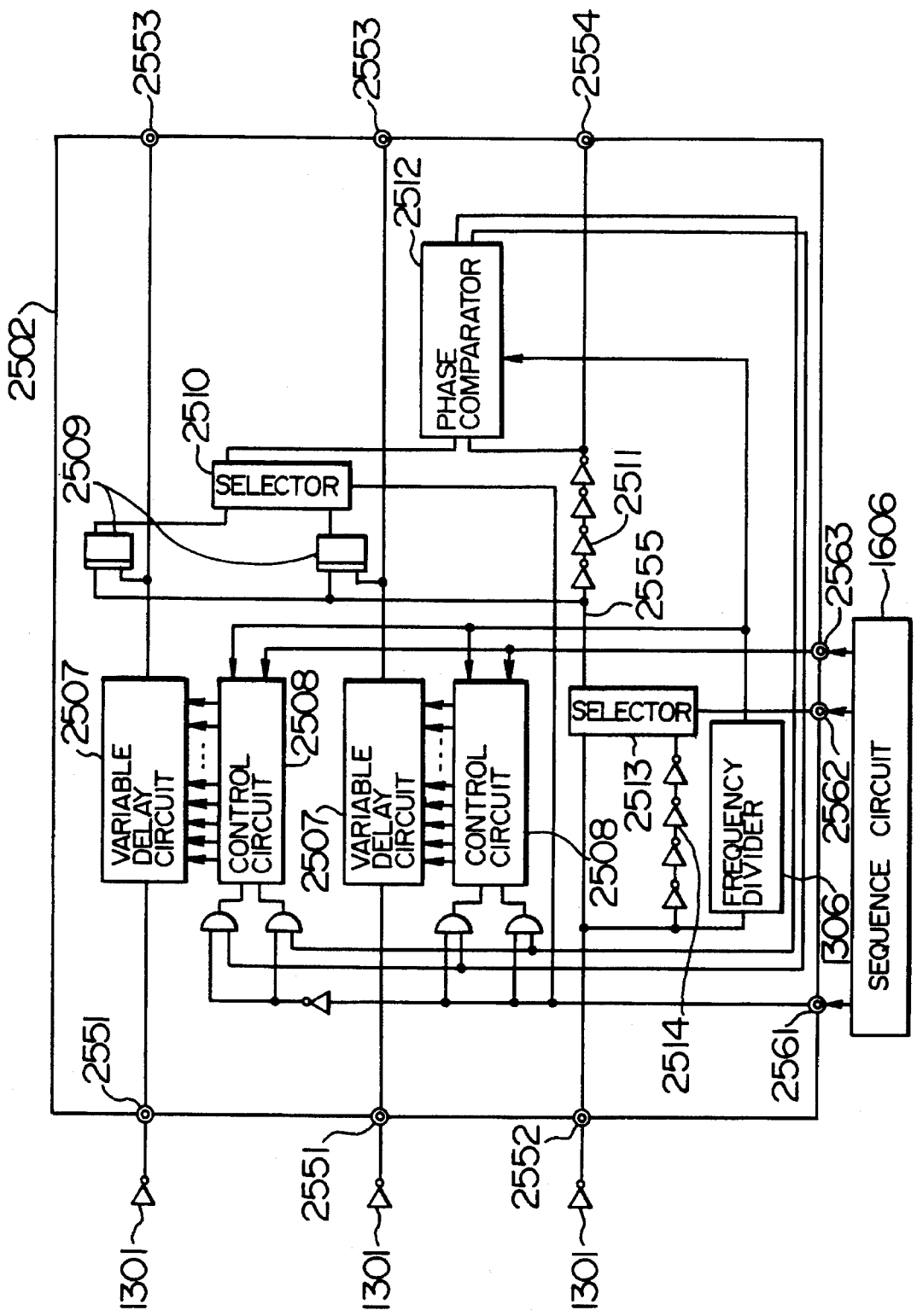
FIG. 27 is a circuit diagram showing an embodiment of a part of the circuit of FIG. 26.

FIG. 24 shows an additional embodiment of the clock signal generator circuit 1202, which is arranged to send a clock signal with different frequencies in rough adjustment and fine adjustment, but always sends a reference signal with a low frequency. In the circuit of FIG. 19, the output of the selector circuit 1903 is used for both the clock signal (output from the terminals 1651) and the reference signal (output from the terminal 1652). In contrast, in the circuit of FIG. 24, the output of the selector circuit 1903 is used only to produce clock signals and the output of the flip-flop circuits 1902 is directly coupled to the flip-flop circuits 1602. A flip-flop circuit 2301 is used to adjust the phase relation between a signal output as a clock signal and a signal output as a reference signal. It ought to be noted that when the frequency of the clock signal is higher than 200 to 300 MHz, it is difficult to transmit a reference signal with the same frequency and with an accurate phase. In such a case, if a circuit as shown in FIG. 23 is used, a reference signal can be sent for fine adjustment with the same frequency as in rough adjustment. The method for producing a clock signal to supply to the logic circuits 1220 based on the clock signal and the reference signal sent as has been described will be described later when FIG. 27 is explained.

Figure 25:
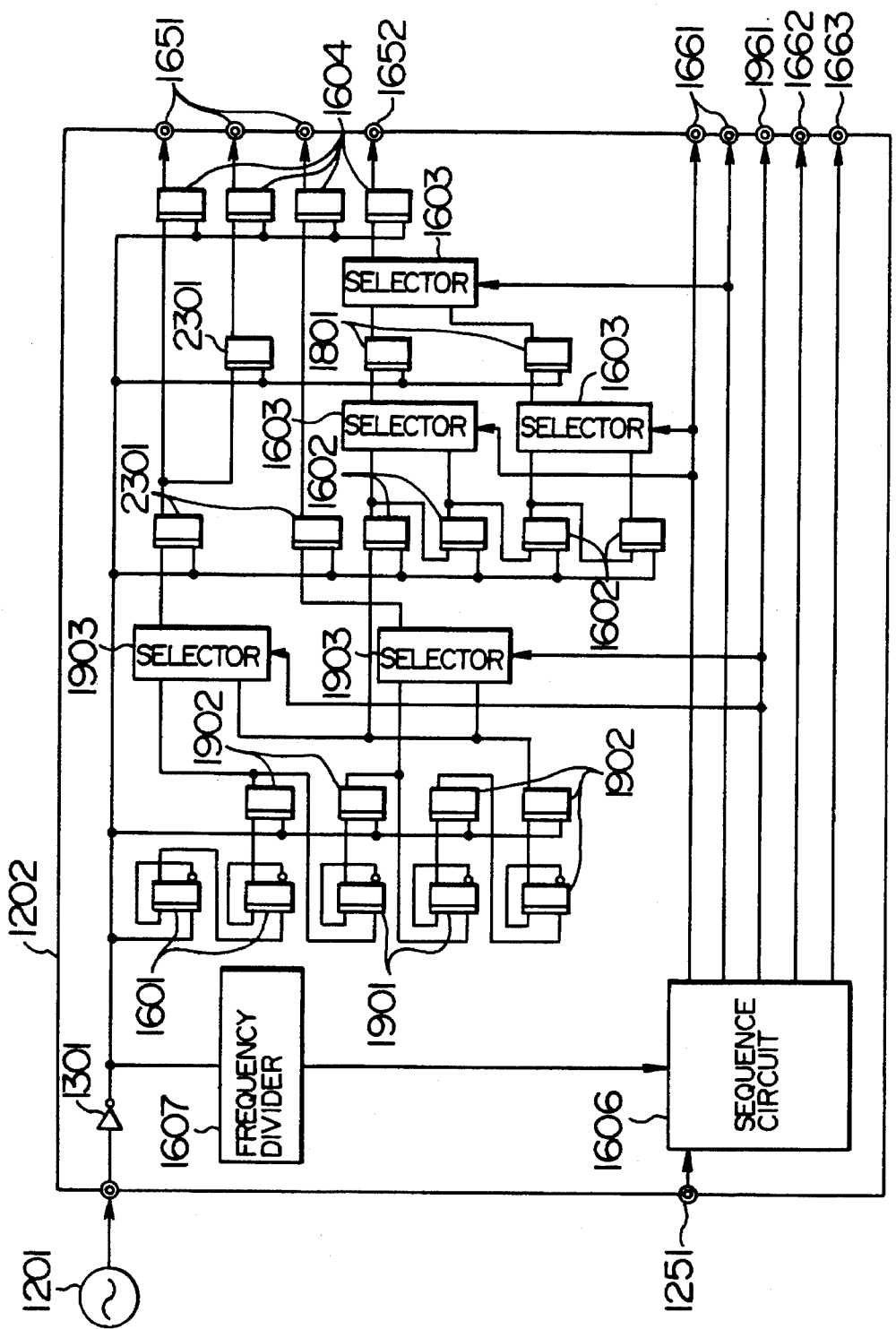
FIG. 25 is a circuit diagram showing another embodiment of the second part of the circuit of FIG. 12.

FIG. 25 shows yet another embodiment of the clock signal generator circuit 1202, which is arranged to transmit clock signals with different frequencies to different signal destinations 1210. This circuit has another selector circuit 1903 and another flip-flop circuit 2301 added to the circuit of FIG. 24, and can supply a clock signal at a frequency further reduced by half than in the circuit of FIG. 14. Because the speed of the circuit is directly related to the performance of equipment, among the logic circuits 1220 there are some portions requiring high-speed operation (the central processing unit, for example), and other portions that one better formed by less expensive devices though slower in speed (the input/output device, for example). In the former, a high-speed clock signal is required, but in the latter, it can happen that the device does not operate unless in step with a low-speed clock signal. The circuit in FIG. 25 is effective in such a case, that is to say, this circuit can supply a high-speed clock signal to some signal destinations 1210 and a slower clock signal at a frequency half as high as the high-speed signal to other destinations 1210 of signals. As for the reference signal, a common signal may be supplied to every destination of signals.

FIG. 26 shows a still further embodiment of the clock signal generator circuit 1202, which is used in a case where it is necessary to supply clock signals of two kinds of frequencies that are not in a multiple-submultiple relation to each other (800 MHz and 600 MHz, for example). This can be realized by providing an oscillator of a frequency of the least common multiple (2400 MHz in the above case) of the two kinds of frequencies, and by performing a frequency division of its output. If a circuit which operates with a frequency obtained as described cannot be realized or is too expensive to produce, the circuit in FIG. 26 can be used to meet the above requirement.

In FIG. 26, reference numeral 2501 denotes a frequency multiplier circuit, 2502 denotes a phase adjusting circuit, 2503 denotes a frequency divider, and 2504 denotes delay circuits, each of which transmits a signal with a delay time substantially equivalent to that of the frequency divider 2503. Reference numeral 2505 denotes a circuit similar to that portion of the circuit in FIG. 19 which is constructed by the flip-flop circuits 1602, 1801, 1604 and the selector circuit 1603 or the like.

In the circuit of FIG. 26, the oscillation frequency of the high frequency oscillator 1201 is the greatest common divisor (200 MHz in the above case) of the frequencies of the two kinds of clock signals, and the frequency of the greatest common divisor is multiplied to required frequencies by the multiplier circuits 2501. In this example, the required frequencies are three times and four times the frequency of the greatest common divisor, respectively, and thus a four-times multiplier circuit can be formed by two-times multiplier circuits connected in two stages. The signals of 600 MHz and 800 MHz thus produced are phase-adjusted in relation to the phase of a signal of 200 MHz by the phase adjusting circuit 2502, and are output as clock signals.

The frequency divider circuits 2503 and the selector circuits 1903 are the circuits for generating, selecting and supplying signals necessary for rough adjustment and fine adjustment like the circuit constructed by the frequency divider circuit made up of the flip-flop circuits 1901 and by the selector circuit 1903, etc. The equivalent delay circuits 2504 are provided to make substantially equal the delay times of the signal paths in rough adjustment and fine adjustment.

In a circuit such as shown in FIG. 19, there is no path where a signal of the maximum frequency is separated into two signals and then input to the same selector, and signals of other frequencies are selected out as individual signals by the selectors' and their phases are adjusted by the flip-flop circuits 1604 before they are output. For this reason, equivalent delay circuits such as those shown in FIG. 26 are not required. However, the circuit in FIG. 26 is so arranged as to select signals of 800 MHz and 600 MHz, and output them as they are, so that the equivalent delay circuits shown in the circuit in FIG. 26 are required.

The reference signal in FIG. 26 is produced by shifting a clock signal of 200 MHz by a clock signal of 800 MHz, and therefore, for a clock signal of 600 MHz, reference signals with phases corresponding to the phases of a first-phase clock signal and a second-phase clock signal, which is an inverted version of the first-phase clock signal, and for a clock signal of 800 MHz, only a reference signal of a phase corresponding to the phase of the first-phase clock signal is supplied.

FIG. 27 shows an embodiment of the phase adjusting circuit 2502. In FIG. 27, reference numeral 2507 denotes variable delay circuits, 2508 denotes delay control circuits, 2509 denotes flip-flop circuits, 2510 and 2513 denote selector circuits, 2511 and 2514 denote delay circuits each for delaying a signal by several stages of gate circuits, and 2512 denotes a phase comparator circuit. In the circuit of FIG. 27, clock signals input to the terminals 2551 are phase-adjusted by the variable delay circuits 2507 and output to the terminals 2553. In this process, phase adjustment is made so that the phase of a signal output to the terminal 2553 is faster than the phase of a signal output to the terminal 2554 by a phase shift corresponding to a delay time caused by the flip-flop circuit 2509 and the selector circuit 2510. Therefore, if this circuit in FIG. 27 is designed so that the above-mentioned delay time is substantially equal to the delay time due to the selector circuit 1903 and the frequency divider circuit 2503 or the equivalent delay circuit 2504 of FIG. 26, the phases of the clock and reference signals input to the shift circuit 2505 can be made substantially the same. By setting different delay times, the signals can be put into a desired lead-lag relation.

A delay circuit 2511 is used to differentiate timing between the clock signals output to the terminals 2553 and the reference signal output to the terminal 2554, which are in the phase relation mentioned above, to ensure that the flip-flop circuits 2509 can securely receive a signal that appears on the internal node 2555. A selector circuit 2513 and a delay circuit 2511 are used to slightly shift the phase of a signal output to the terminal 2554 in order to execute readjustment after the phase adjustment has been finished once.

When signals input to the phase comparator circuit 2512 are 180° out of phase with each other, neither of the leading and lagging signals is output, so that phase adjustment does not progress. This phenomenon is prevented by this circuit. As a time required for phase adjustment has elapsed after it is started, the signals become either just 180° out of phase or just in phase with each other, and are not in any other state intermediate between them. If the signal output to the terminal 2554 is phase-shifted to such an extent as to enable the phase comparator circuit 2512 to determine a phase shift of 180°, when there is actually a phase shift of 180°, the phase adjustment is started, or when there is no phase shift, the signals are readjusted to the extent to which they were shifted. As a result, after the readjustment, the signals are invariably set in phase with each other after all.

A sequence signal input to the terminal 2562 is a signal by which to perform this readjustment. A sequence signal input to the terminal 2563 is used to appropriately reset or set the flip-flop circuits in the control circuit 2508 to thereby set the delay time of the variable delay circuit 2507 substantially at the center of the variable range, and this setting is done before starting the initial adjustment. By dint of this signal, a single phase comparator circuit 2512 can be used for phase adjustment of both signals.

The order of changing over the sequence signals is as follows. By the signal input from the terminal 2563, central values of the variable delay circuits 2507 are set; then, the sequence signal input from the terminal 2561 is changed over at time intervals sufficient to perform phase adjustment with this signal both at the high and low levels, and the sequence signal input from the terminal 2562 is changed over, and finally, the sequence signal input from the terminal 2562 is again changed at time intervals long enough to perform phase adjustment with this signal both at the high and low levels. The phase adjustment of this circuit is thus finished. After completing the phase adjustment of this circuit, the phase adjusting circuit 1211 in each signal destination 1210 is adjusted by changing the sequence signals output to the terminals 1661 to 1663 and 1961 in the usual manner.

If it is desired that the circuit in FIG. 27 should always follow up changes of temperature, an additional sequence signal is provided to fix the output of the control circuit in charge of the portions of the circuit which need not follow changes of temperature, and after the phase adjustment is finished by executing the above-mentioned procedure, the output of that control circuit is fixed. Subsequently, the sequence signal input from the terminal 2561 (the signal may be the same signal as is output at the terminal 1661) is changed periodically, and adjustment of the inside of each destination 1210 is started.

Figure 28:
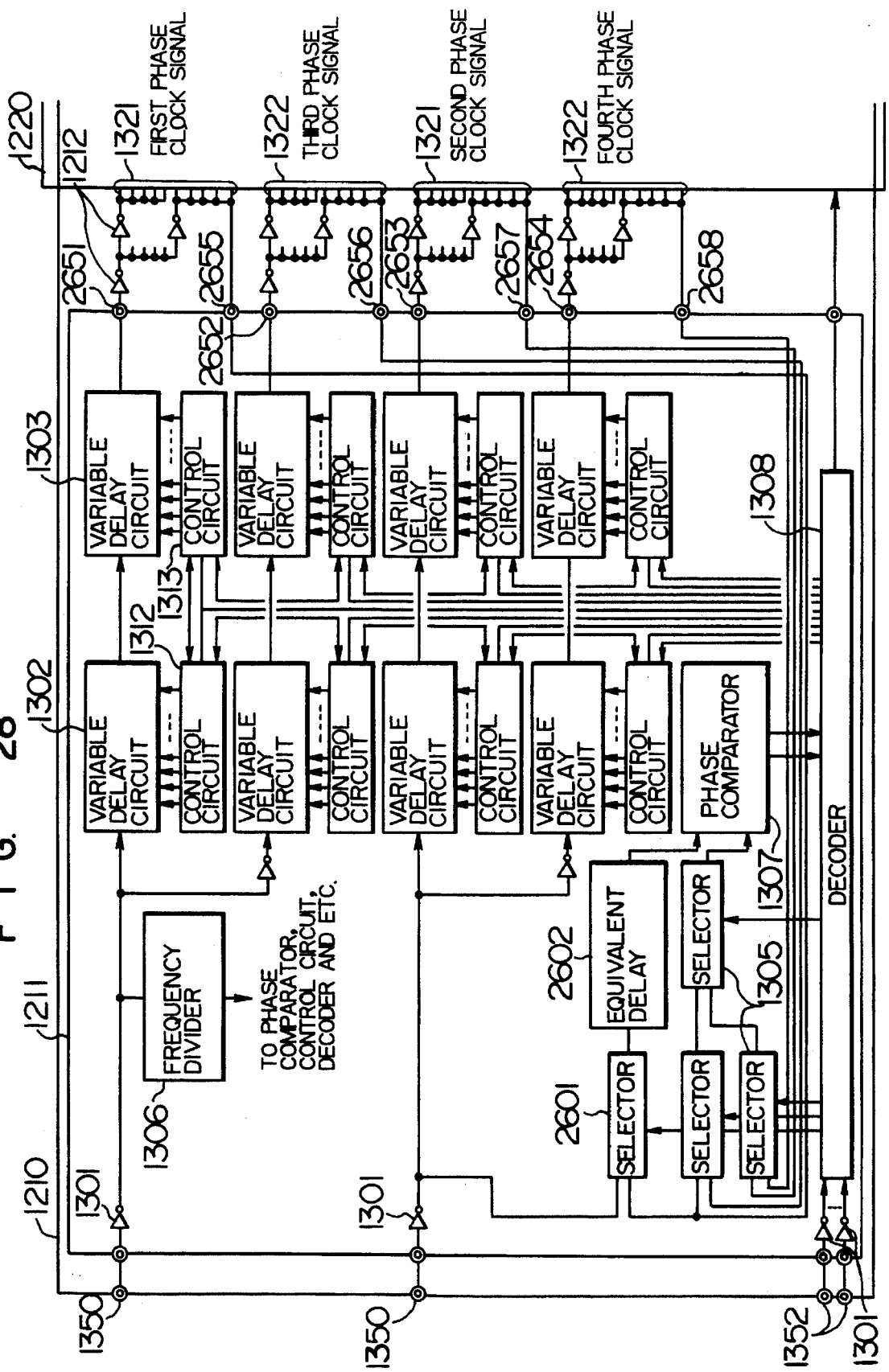
FIG. 28 is a circuit diagram showing another embodiment of the second part of the circuit of FIG. 12.

FIG. 28 shows another embodiment of the phase adjusting circuit 1211 used in each signal destination 1210, and this circuit includes common paths through which clock and reference signals are transmitted as shown in FIG. 21. In FIG. 28, reference numeral 2601 denotes selector circuits, and 2602 denotes a delay circuit arranged so as to produce the same delay time as the selector circuits 1305. The other parts of the circuit are the same as the circuit of FIG. 13, except that clock signals of four phases are output instead of clock signals of two phases as in FIG. 13.

If phase adjustment is performed using the circuit in FIG. 28, when first and third-phase clock signals are to be phase-adjusted, a signal input from the input terminal 1350 on the lower side is selected with the selector circuits 2601, and input to a phase comparator circuit 1307. When second-phase and fourth-phase clock signals are to be phase-adjusted, a reference signal supplied through the path of the first-phase clock signal is selected with the selector circuits 2601, and input to the phase comparator circuit 1307. Therefore, the first-phase and the third-phase clock signals are adjusted by directly comparing with a reference signal input to the chip, as in the circuit of FIG. 13. The second-phase and the fourth-phase clock signals are compared with a reference signal supplied through the path of the first-phase clock signal which has already been adjusted, so that they are indirectly but practically compared with a reference signal input from the input terminal 1350 on the lower side in FIG. 28. Therefore, the clock signals of all phases are compared with a reference signal on the lower side.

The accuracy of the phase adjustment is improved if the path of the reference signal is provided independently, but this embodiment is effective in saving the path of high-speed signals when it is desirable to produce the whole system at a low cost.

If such control is performed as to follow up changes of temperature with the circuit in FIG. 28 while the logic circuits are in operation, by having a reference signal in phase with a clock signal of any one of the phases match a signal input from the clock signal input terminal 1350 on the lower side, it is possible to have a signal of that phase follow up changes of temperature. If it is desired that signals of a plurality of phases should follow up changes of temperature, as will be described later with reference to FIG. 30, it is only necessary to apply the same control signal to signals of other phases with the signal of that phase regarded as the representative phase.

Figure 29:
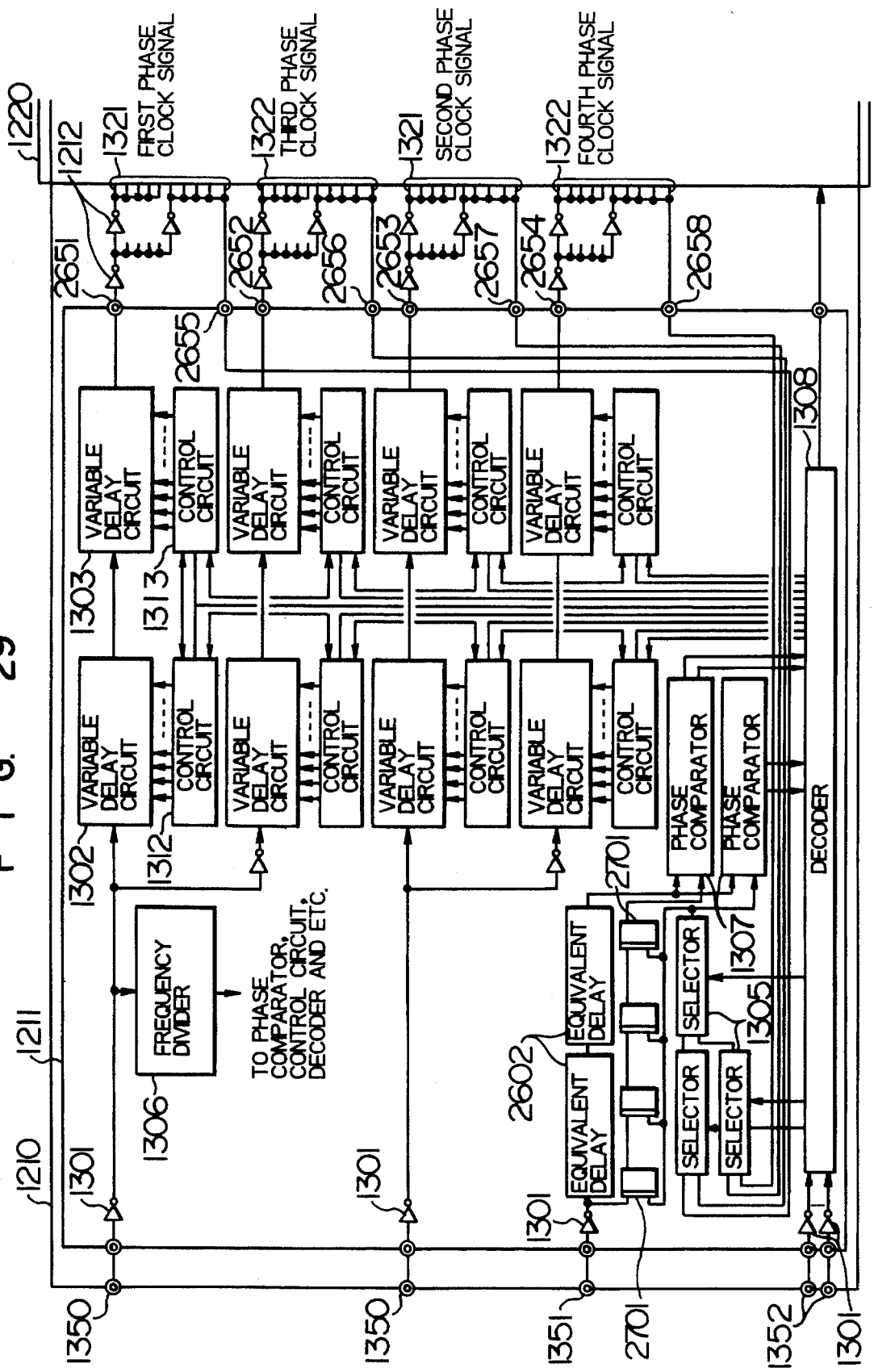
FIG. 29 is a circuit diagram showing a further embodiment of the second part of the circuit of FIG. 12.

FIG. 29 shows a further embodiment of the phase adjusting circuit 1211 used in each signal destination 1210, which embodiment is used in a case where a reference signal is transmitted with a lower frequency than that of the clock signals as in FIG. 14. This circuit includes a system for comparing phases when a clock signal and a reference signal having the same frequency are supplied during rough adjustment, and a system for comparing phases when only a clock signal of a high frequency is supplied during fine adjustment and during operation.

In the circuit of FIG. 29, when a clock signal and a reference signal have the same frequency, a phase comparator circuit 1307 on the lower side in FIG. 29 is used. If the clock signal has a higher frequency, the phase of the reference signal synchronized with the clock signal by the flip-flop circuit 2701 is compared with the reference signal in the original phase state.

In the circuit of FIG. 29, there are provided two separate phase comparator circuits 1307, but the portions of the comparator circuits after the portions for synchronizing the comparison result with the low-frequency clock signal (the flip-flop circuits 1405 in FIG. 14) may be designed as a circuit for common use. In place of the circuit of FIG. 29, it is also possible to use the circuit disclosed in FIGS. 12, 15 to 18 and so on in JP-A-63-231516, for example.

Figure 30:
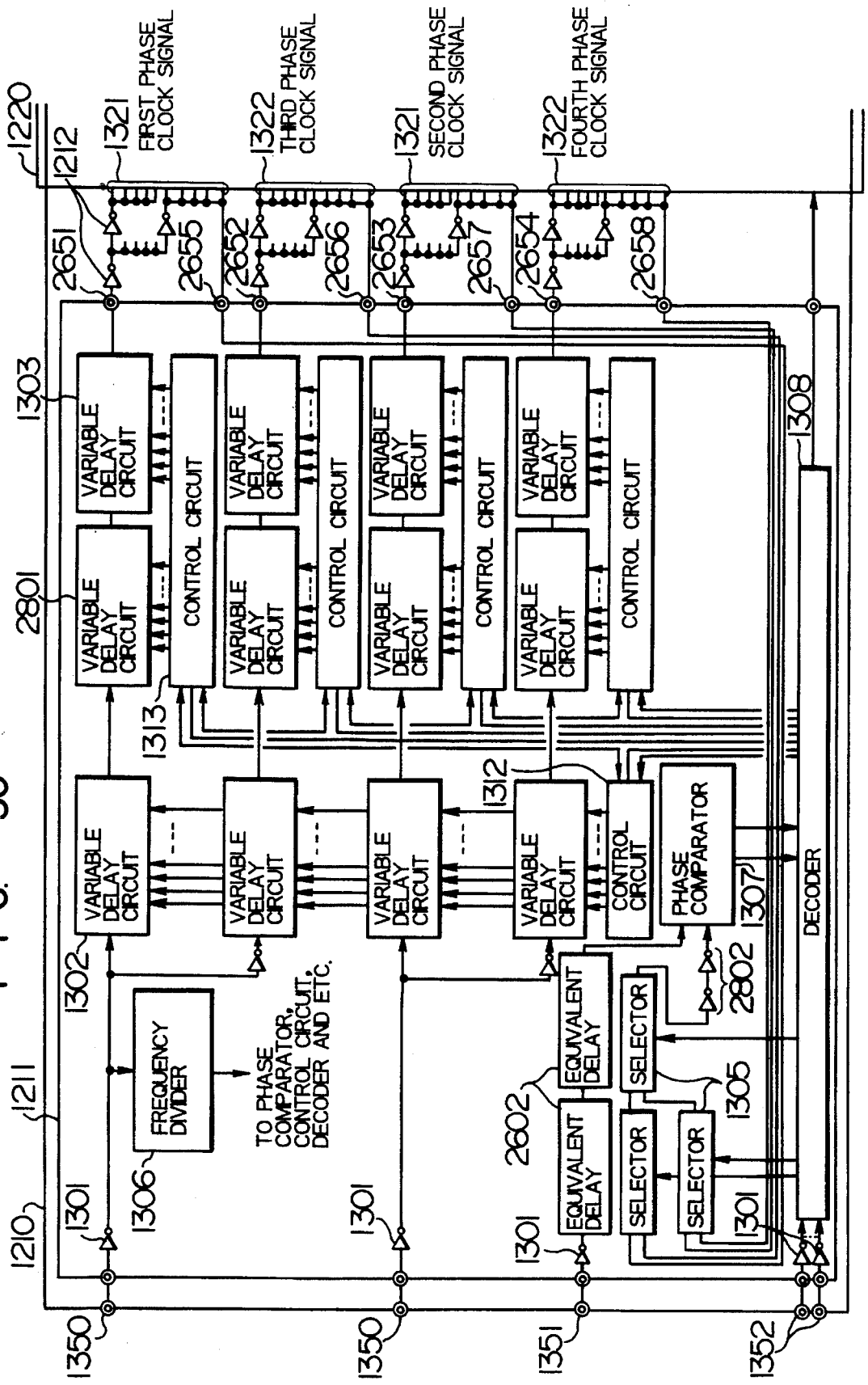
FIG. 30 is a circuit diagram showing yet another embodiment of the second part of the circuit of FIG. 12.

FIG. 30 shows yet another embodiment of the phase adjusting circuit 1211 used in each signal destination 1210, which embodiment makes it possible to reduce and save the material of the control circuit 1312 to follow up changes of temperature or the like while the logic circuits are in operation. More specifically, rough adjustment and fine adjustment before operating the logic circuits 1220 are carried out by adjusting the control circuits 1313 controlling the variable delay circuits 1303 one after another just as in the cases mentioned above. In order for the signals to follow changes of temperature or the like during the operation of the logic circuits, a clock signal of one phase is picked out as a representative phase and only its phase is adjusted. Then, the same control signal is applied to the variable delay circuits 1302 of clock signals of other phases.

If the phase adjusting circuits 1211 and the buffer circuits 1212 are included in one LSI, the circuit elements constituting those circuits can be assumed to be at substantially the same temperature at all times. Therefore, if a control signal is obtained that follows up the changes of temperature of any one circuit element, it is considered possible to use the same control signal to follow up the temperature change of the other elements in delay time control.

The variable delay circuits in FIGS. 5 and 7 which vary the delay time according to the number of gate stages have a rougher resolution in detecting delay time variation than the variable delay circuits in FIGS. 1 to 4. Therefore, if the initial adjustment is finished at this degree of adjustment, the accuracy of the phases of other clock signals is lower than the representative phase. In order to avoid this, in the circuit of FIG. 30, variable delay circuits 2801 are added to change over the delay time according to the magnitude of load, thereby improving the resolution of the variable delay circuits 1303. If the variable range of the variable delay circuits 2801 is set to be greater than the minimum resolution of the variable delay circuits 1303, this will be sufficient.

If control as described is performed, after a sequence signal which decides whether or not to put the logic circuits into operation, for example (a signal output to the terminal 1662 by the sequence circuit 1606), goes to the high level, by fixing a sequence signal to decide a reference signal of which phase to transmit (a sequence signal output to the terminal 1661), it is possible to always transmit a reference signal corresponding to a clock signal of the representative phase, and to adjust only that signal phase.

Reference numeral 2802 denotes a circuit for transmitting a signal with a delay time substantially equal to that of the input buffer circuits 1301. This circuit serves to cancel off the variations in delay time among the input circuits 1301 of different LSIs, and represses the variations to substantially relative variations of delay time of the two kinds of circuits (the input buffer circuits 1301 and the delay circuit 2802). If there are some parts which produce equal delay times in the delay circuits 2802 and 2602, the corresponding delay times on both sides can be omitted.

Figure 31:
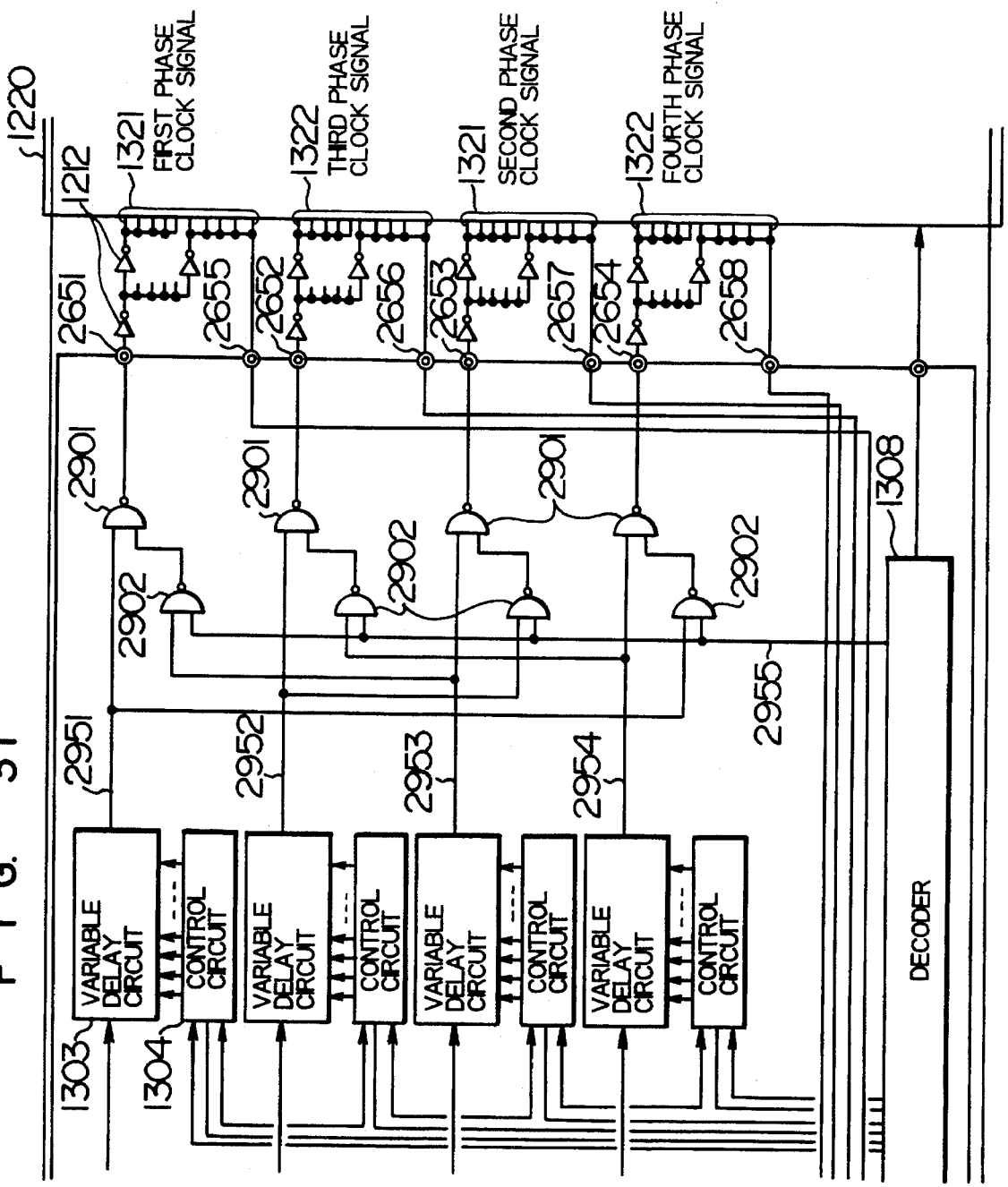
FIG. 31 is a circuit diagram showing another embodiment of a part of the circuit of FIG. 27.

FIG. 31 shows an embodiment of a circuit which produces clock signals of four phases with a duty ratio of 25% from clock signals of four phases with a duty ratio of 50% obtained by the embodiments shown in FIGS. 28 to 30. According to the present invention, clock signals of four phases adjusted with high accuracy can be obtained, and therefore, a circuit such as this can be produced for practical application. This circuit has included therein NAND circuits 2901, 2902 between variable delay circuits 1303 and terminals 2651 to 2654, and produces 25%-duty-ratio clock signals from 50%-duty-ratio clock signals of respective phases output on the internal nodes 2951 to 2954 by suppressing these signals by clock signals of the subsequent phases. Phase adjustment is performed on one of the edges (rising edges, for example) of clock signals of the respective phases, so that the other edges of the signals are adjusted automatically.

If a clock signal has a phase shift of more than 25% of its period before rough adjustment, there is a possibility that specified pulses cannot be produced. Therefore, in rough adjustment, the signal is adjusted with the duty ratio remaining at 50% and the internal node 2955 set at the low level, and the node is changed to the high level in fine adjustment and prior to the operation of the variable delay circuit, after which a clock signal with a duty ratio of 25% is output.

Figure 32:
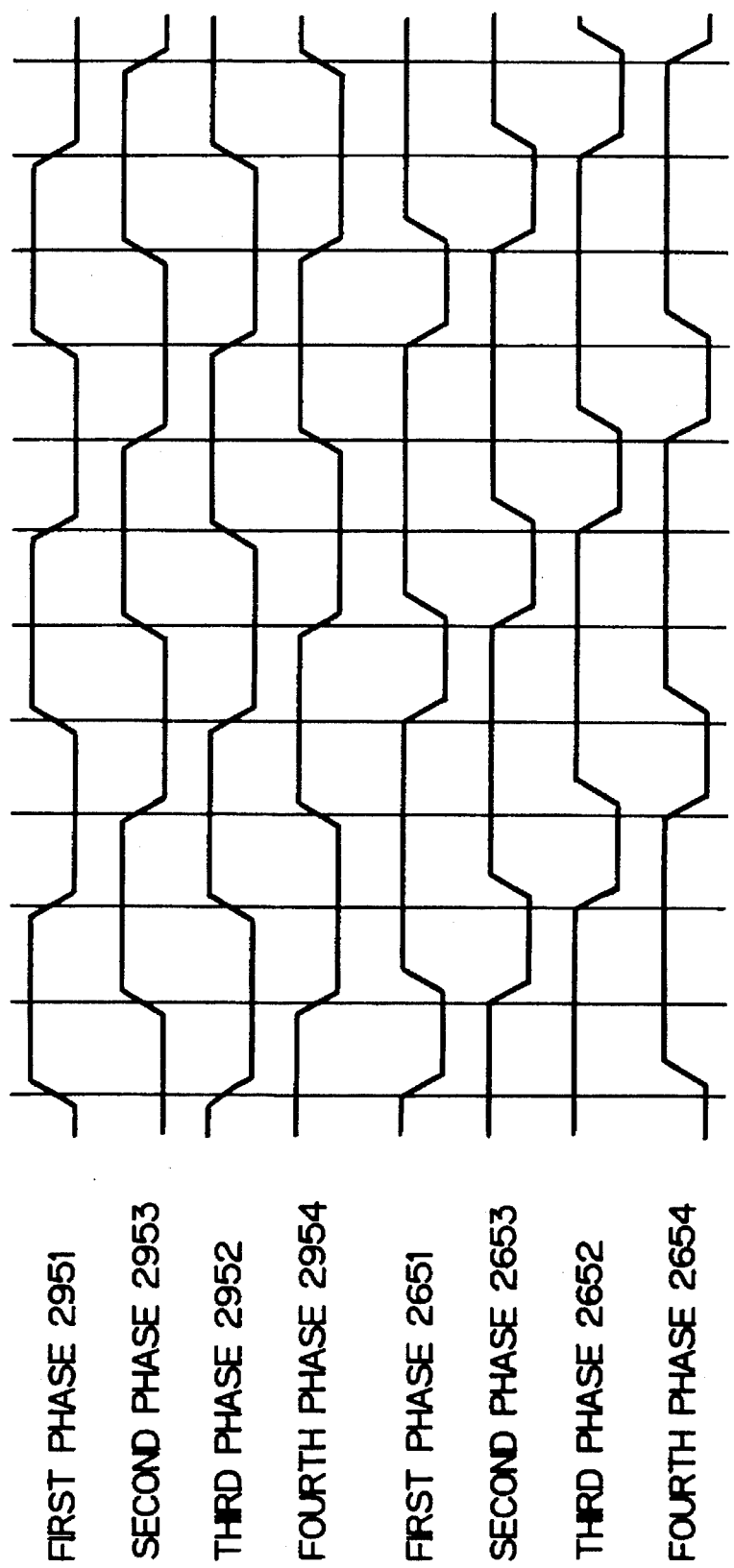
FIG. 32 is a diagram showing signal waveforms in the circuit of FIG. 31.

FIG. 32 shows signal waveforms which appear at the respective nodes. For example, the waveform that appears at the node 2651 is at the low level only when the node 2951 is at the high level and the node 2953 is at the low level, and the waveform is at the high level in the other states of the nodes. Those clock signals can be supplied with either positive or negative polarity as selected by the number of stages of buffer circuits 1212. By supplying the same signal to the phase comparator circuit 1307, this signal can be used as a reference signal having the same waveform as the signal supplied to the flip-flop circuits 1221.

The selector circuits used in the circuits shown in the drawings from FIG. 13 on should preferably output a signal with the same delay time regardless of which of the upper or lower input terminal the signal is output from. The selector circuit shown in FIG. 6 is asymmetrical with respect to the PMOS side, and does not satisfy this specification.

Figure 33:
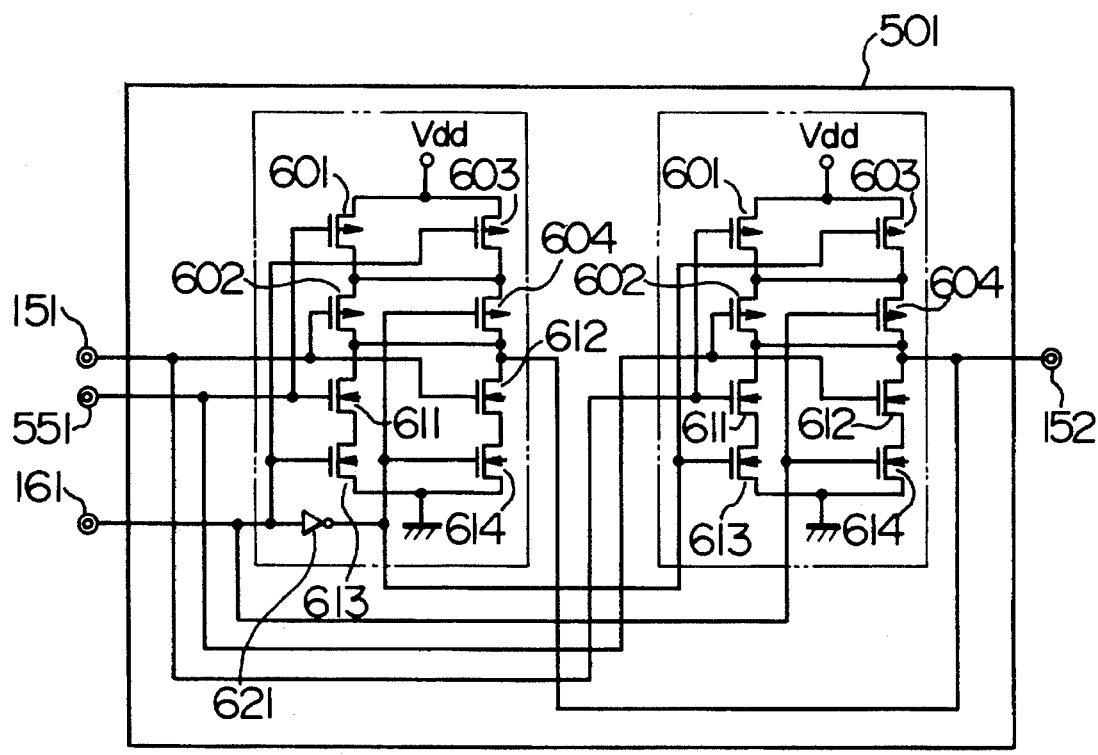
FIG. 33 is a circuit diagram showing an embodiment of a selector circuit used in a clock signal phase adjusting device according to the present invention.

An example which solves this problem is shown in FIG. 33. In the circuit of FIG. 33, two sets of selector circuits of FIG. 6 are arranged with an output terminal 152 used as a common terminal, and the upper and the lower input terminals 151 and 551 are connected to those selector circuits so that they intersect each other. Signals input from the control terminal 161 are used as signals of opposite polarity. By this arrangement, the circuit from the input terminals 151 and 551 to the output terminal 152 is symmetric, so that delay times are equal in length.

As described above, according to the present invention, it is possible to form a variable delay circuit with a small minimum delay time and a large variable range, or a variable delay circuit and a delay control circuit which do not produce a spike-like noise even if the delay time is varied during the operation. Furthermore, by constructing a phase adjusting device for clock signals by using a variable delay circuit such as these, it is possible to supply clock signals with high phase accuracy.

What is claimed is:

1. A variable delay circuit for transferring an input signal with a variable delay which depends upon a group of binary control signals, comprising:

a plurality of selectors each provided in correspondence to and controlled by one of the binary control signals, each selector having first, second and third inputs and an output, said first and second inputs being supplied with signals to be selected by said each selector and said third input being supplied with one of the group of binary control signals, said each selector selecting one of the signals to be selected depending upon a value of the one binary control signal, said each selector supplying said output with the selected one signal;

said first input of each selector being connected to receive said input signal;

said plurality of selectors being connected in series in such a manner that the output of an i-th one of said selectors is connected to the second input of an (i − 1)-th one of said selectors, wherein i = 2, 3, ... n, and Wherein n is the number of selectors;

wherein a first one of said selectors provides a delayed signal of the input signal to said output of said first selector with a delay time which is dependent upon a number of selectors through which the input signal passes in series until said input signal reaches said output of said first selector.

2. A variable delay circuit according to claim 1, wherein the first and second inputs of one of said selectors receive identical signals.

3. A variable delay circuit according to claim 1, further comprising a plurality of gate circuits respectively connected to the first inputs of each of the selectors except for said first selector.

4. A variable delay circuit according to claim 3, wherein said plurality of gate circuits are connected together in series, one terminal of the series connection of said gate circuits receives said input signal, and each connecting point between adjacent gate circuits is connected to a respective one of said first inputs of said selectors.

5. A variable delay circuit according to claim 4, wherein each of said gate circuits is an inverter circuit, and each of said selectors inverts the input signal.

6. A variable delay circuit according to claim 5, wherein the second input of an n-th one of said selectors receives the input signal supplied to the first input of said n-th selector via another gate circuit.

7. A variable delay circuit according to claim 6, wherein said another gate circuit includes two inverter circuits connected together in series.

8. A variable delay circuit according to claim 4, wherein each of said gate circuits isolates an input thereof from any capacitance coupled to an output thereof.

9. A variable delay circuit according to claim 1, further comprising:

a minimum-delay selector which has a first input receiving the input signal, a second input connected to the output of said first selector, a third input receiving a binary control signal, and an output providing an output signal of said variable delay circuit, wherein one of the signals at said first and second inputs of said minimum-delay selector is selected as said output signal of said variable delay circuit in accordance with said binary control signal at said output of said minimum-delay selector;

a prolonged-delay selector which has a first input receiving said input signal, a second input, a third input receiving a binary control signal, and an output providing an output signal supplied to the first input of said first selector, wherein one of the signals at said first and second inputs of said prolonged-delay selector is selected as said output signal of the variable delay circuit in accordance with said binary control signal at said third input of said prolonged-delay selector; and means for delaying and then outputting the thus delayed input signal in accordance with a binary control signal to the second input of said prolonged-delay selector.

10. A variable delay circuit for transferring a signal input thereto with a variable delay which depends upon values of a group of binary control signals, comprising:

a plurality of selectors each provided in correspondence to and controlled by one of the binary control signals, each selector having first, second and third inputs and an output, said first and second inputs being supplied with signals to be selected by said each selector and said third input being supplied with one of the group of binary control signals, said each selector selecting one of the signals to be selected depending upon a value of the one binary control signal, said each selector supplying said output with the selected one signal; and a plurality of delay circuit elements each provided in correspondence to one of said plurality of selectors and series connected with each other, a first one of said delay circuit elements being connected to receive said input signal, and an output of an i-th one of said plurality of delay circuit elements being connected to said first input of an i-th one of said selectors, wherein i = 2, 3 . . . n, and wherein n is the number of selectors and delay circuit elements;

said plurality of selectors being connected together in series in such a manner that the output of a j-th one of said selectors is connected to the second input of a (j − 1)-th one of said selectors, wherein j = 2, 3, . . . n;

wherein a first one of said selectors provides a delayed signal of the input signal to said output of said first selector with a delay time which is dependent upon a number of delay circuit elements through which the input signal passes in series until said input signal reaches said output of said first selector.

11. A variable delay circuit according to claim 10, wherein each of said delay circuit elements is a gate circuit.

12. A variable delay circuit according to claim 11, wherein each said gate circuit is an inverter circuit, and each of said selectors inverts the input signal.

13. A variable delay circuit according to claim 12, wherein each of said gate circuits isolates an input thereof from any capacitance coupled to an output thereof.

14. A variable delay circuit according to claim 10, further comprising a minimum-delay selector which has a first input receiving the input signal, a second input connected to the output of said first selector, a third input receiving a binary control signal, and an output providing an output signal of said variable delay circuit, wherein one of the signals at said first and second inputs of the minimum-delay selector is selected as said variable delay circuit output signal in accordance with said binary control signal at said output of said minimum-delay selector.

* * * * *